(12) United States Patent
Nakano et al.

(10) Patent No.: US 7,095,178 B2
(45) Date of Patent: Aug. 22, 2006

(54) PLASMA PROCESSING APPARATUS, METHOD FOR OPERATING THE SAME, DESIGNING SYSTEM OF MATCHING CIRCUIT, AND PLASMA PROCESSING METHOD

(75) Inventors: Akira Nakano, Miyagi-ken (JP); Tadashi Kumagai, Fukushima-ken (JP); Tomofumi Oba, Miyagi-ken (JP); Tadahiro Ohmi, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 331 days.

(21) Appl. No.: 10/302,007

(22) Filed: Nov. 21, 2002

(65) Prior Publication Data

US 2003/0097984 A1 May 29, 2003

(30) Foreign Application Priority Data

Nov. 27, 2001 (JP) ............................ 2001-361378
Nov. 30, 2001 (JP) ............................ 2001-367638

(51) Int. Cl.
*H01J 7/24* (2006.01)
*C23C 16/00* (2006.01)
(52) U.S. Cl. .................. 315/111.21; 118/723 MW
(58) Field of Classification Search ........... 315/111.11, 315/111.71, 111.21, 111.51, 111.91; 118/723 MW, 118/723 E; 219/696, 746
See application file for complete search history.

(56) References Cited

U.S. PATENT DOCUMENTS

| 5,605,576 | A | 2/1997 | Sasaki et al. ............. 118/723 E |
| 6,252,354 | B1* | 6/2001 | Collins et al. ........... 315/111.51 |
| 6,259,334 | B1* | 7/2001 | Howald ...................... 333/17.3 |
| 6,583,572 | B1* | 6/2003 | Veltrop et al. ........... 315/111.51 |
| 6,716,301 | B1* | 4/2004 | Kanno et al. ............ 156/345.28 |
| 6,806,438 | B1* | 10/2004 | Nakano et al. .......... 219/121.54 |
| 2001/0009139 | A1* | 7/2001 | Shan et al. ............... 118/723 E |

* cited by examiner

Primary Examiner—Tuyet Vo
Assistant Examiner—Minh Dieu A
(74) Attorney, Agent, or Firm—Beyer, Weaver & Thomas LLP.

(57) ABSTRACT

A plasma processing apparatus includes a radio frequency generator, a plasma processing chamber, a matching circuit for impedance matching between the radio frequency generator and the plasma processing chamber, and matching circuit adjusting means for matching the output impedance of the matching circuit to the impedance of the plasma processing chamber in a nondischarge state. The matching circuit is a product matching circuit that is produced based on a circuit constant of an adjusting matching circuit. The adjusting matching circuit is disposed between the radio frequency generator and the plasma processing chamber for a required plasma treatment and the circuit constant is determined by impedance matching between the radio frequency generator and the plasma processing chamber so that the adjusting matching circuit matches the load impedance of the plasma processing chamber.

22 Claims, 15 Drawing Sheets

FIG. 10

| IDENTIFICATION NUMBER | PLASMA PROCESSING CHAMBER SERIAL NO. | IMPEDANCE $Z_0$ | IMPEDANCE $Z_1$ |
|---|---|---|---|
| X1234 | JDH324 | a+bj | c+dj |
| ⋮ | ⋮ | ⋮ | ⋮ |
| Z6789 | JEF846 | W+Xj | Y+Zj |

FIG. 11

| ITEM \ DATE | 2001/12/8 | 2001/8/15 | 2001/5/3 |
|---|---|---|---|
| DISPLACEMENT D1 OF LOAD CAPACITOR | x | ... | ... |
| DISPLACEMENT D2 OF TUNING CAPACITOR | y | ... | ... |
| IMPEDANCE $Z_1$ | 3.6+1.4j | ... | ... |
| INDUCTANCE OF TUNING INDUCTOR | 100(nH) | ... | ... |
| CAPACITANCE OF TUNING CAPACITOR | 411(pF) | ... | ... |
| CAPACITANCE OF LOAD CAPACITOR | 253(pF) | ... | ... |

PLASMA PROCESSING APPARATUS, METHOD FOR OPERATING THE SAME, DESIGNING SYSTEM OF MATCHING CIRCUIT, AND PLASMA PROCESSING METHOD

BACKGROUND OF THE INVENTION

1. Field of the Invention

The present invention relates to a plasma processing apparatus used in semiconductor process plasma treatments such as ashing and etching, a method for operating the plasma processing apparatus, and a plasma processing method using the plasma processing apparatus.

The present invention also further relates to a system for designing a matching circuit that matches the load impedance of a plasma processing chamber of the plasma processing apparatus.

2. Description of the Related Art

FIG. 15 shows a typical conventional single-frequency excitation plasma processing apparatus which is used in plasma processes such as a chemical vapor deposition (CVD) process, a sputtering process, a dry etching process, and an ashing process. This plasma processing apparatus includes a matching circuit 2C between a radio frequency generator 1 and a plasma excitation electrode 4. The matching circuit 2C matches the impedance between the radio frequency generator 1 and a plasma processing chamber CN.

The RF power from the radio frequency generator 1 is fed into the plasma excitation electrode 4 through the matching circuit 2C. The matching circuit 2C is accommodated in a conductive matching box 2. The plasma excitation electrode 4 and a feed plate 3 are covered with a conductive chassis 21.

An annular projection 4a is provided on the bottom face of the plasma excitation electrode (cathode) 4, and a shower plate 5 having many holes 7 comes into contact with the projection 4a below the plasma excitation electrode 4. The plasma excitation electrode 4 and the shower plate 5 define a space 6. A conductive gas-feeding pipe 17 is connected to the space 6 and is provided with an insulator 17a at the middle portion thereof to insulate the plasma excitation electrode 4 and the gas source.

Gas from the gas-feeding pipe 17 is introduced into a plasma processing space 60 surrounded by a chamber wall 10, via the holes 7 in the shower plate 5. An insulator 9 is disposed between the chamber wall 10 and the plasma excitation electrode (cathode) 4 for insulation therebetween. An exhaust system is omitted from the drawing.

A wafer susceptor (susceptor electrode) 8, which holds a substrate 16 and also functions as another plasma excitation electrode, is supported by a shaft 13 in the plasma processing space 60.

The lower portion of the shaft 13 and the chamber bottom 10A are hermetically sealed with bellows 11. The wafer susceptor 8 and the shaft 13 can be moved vertically by the bellows 11 so as to control the distance between plasma excitation electrodes 4 and the susceptor electrode 8. The wafer susceptor 8 is DC-grounded and has the same DC potential as that of the chamber wall 10.

In this plasma processing apparatus, RF power of a frequency of about 40.68 MHz is generally fed to generate a plasma between the two electrodes 4 and 8 for plasma treatments such as CVD, sputtering, dry etching, and ashing.

In general, the main components, including the plasma processing chamber CN, of the plasma processing apparatus are manufactured by an apparatus manufacturer whereas the matching circuit 2C and the radio frequency generator are manufactured by an electrical manufacturer. Hence, a user of the plasma processing apparatus must perform impedance matching between the plasma processing chamber CN and the radio frequency generator 1 by adjusting the matching circuit 2C for each plasma treatment such as sputtering, dry etching, or ashing. Herein the impedance (load impedance) of the plasma processing chamber CN before the plasma generation is designated as Z0 or after the plasma generation as Z1.

The impedance Z0 is partially determined in a designing process by the manufacturer and can be precisely measured for that specific chamber; however, manufactured plasma processing chambers have different impedances due to dimensional differences generated in the manufacturing processes.

Furthermore, after the plasma is generated, the impedance Z1 varies with process parameters including the flow rate of gas used, the degree of vacuum in the plasma processing chamber, and the distance between the two electrodes 4 and 8. Thus, the impedance Z1 will differ from one plasma treatment to the next in the same plasma processing apparatus. Accordingly, the impedance Z1 is a parameter that should be determined after optimization of the plasma treatment that is performed by the user.

For example, in a dry etching apparatus, the impedance Z1 varies with the type of material of thin film material to be etched and etching conditions such as an etching rate and the shape of a portion to be etched. Also in a film deposition apparatus, the impedance Z1 varies with the process gas composition for forming a thin film and deposition conditions such as a deposition rate and the structure of the thin film. Thus, the actual impedance Z1 of their apparatuses cannot be provided as design information by the apparatus manufacturer and the RF generator manufacturer on a delivery of the apparatuses to users.

Accordingly, the RF generator manufacturer sets a wide margin for user adjustment of the impedance of the matching circuit 2C so that the matching circuit 2C can be used for plasma processing chambers having different impedances Z0 and processes having different impedances Z1. The users must adjust the output impedance of the matching circuit 2C to the impedance Z0 before plasma treatment and then to the impedance Z1 after plasma discharge so as to stabilize the plasma discharge.

At the beginning of the plasma treatment, namely, at or after the beginning of the plasma discharge, the output impedance of the matching circuit 2C is adjusted to the impedance Z1 by resetting a tuning capacitor and a load capacitor to the maximum or minimum. Then, the capacitances of the tuning capacitor and the load capacitor of the matching circuit 2C are adjusted by a control circuit 14 so that the output impedance of the matching circuit 2C is adjusted to the impedance Z1 of the plasma chamber after plasma discharge.

The control circuit 14 adjusts the capacitances of the load capacitor and the tuning capacitor to minimize the electric power such as spurious power of the reflected waves as measured by a reflected wave detector 15. The reflected wave detector 15 is disposed between the matching box 2 and the radio frequency generator 1. The load capacitor and the tuning capacitor are variable capacitors of which capacitances can be varied, for example, by rotation of motors (not shown in the drawing) that are driven by the control circuit 14.

In the above conventional plasma processing apparatus, the adjustment of the output impedance of the matching circuit 2C to the impedance Z0 requires many hours of work before plasma treatment commences. Furthermore, a user of the plasma processing apparatus cannot know the exact impedance Z0; hence, the control circuit 14 cannot adjust the output impedance of the matching circuit 2C to the impedance Z0 in some cases. In such cases, plasma is not discharged because of impedance mismatching.

Furthermore, the impedance Z1 of the matching circuit 2C after plasma discharge is not stored in the conventional plasma processing apparatus; thus, the adjustment of the output impedance to the impedance Z1 also requires many hours of work.

When plasma discharge starts in the plasma processing chamber CN, the output impedance of the plasma processing chamber CN varies from Z0 to Z1. Since the user does not know the value of the impedance Z1, the output impedance cannot be exactly set to Z1. Thus, the effect of the plasma discharge decreases due to mismatching.

Further, in the conventional configuration, the inductance of a tuning inductor of the conventional plasma processing apparatus must be large in order to achieve a wide margin of the output impedance of the matching circuit 2C. Unfortunately, this results in a large parasitic RF resistance component for the tuning inductor of the plasma processing apparatus. As a result, power loss in the matching circuit 2C increases.

For example, for a radio frequency generator 1 having a frequency of 40.68 MHz, the impedance Z1 of the plasma processing chamber is 3.6 $\Omega$+j1.4 $\Omega$. Referring to FIG. 16, the matching circuit includes a resistor 101 and an inductor 102. The resistor 101 represents a parasitic RF resistance of a feed line between a coaxial cable 1A from the radio frequency generator 1 and the tuning inductor and has a resistance of 0.33 $\Omega$ at 40.68 MHz. The inductor 102 is a parasitic inductance of the feed line and has an inductance of 161 nH.

The relationship between constants (design circuit constants) of individual elements constituting the matching circuit will now be described with reference to the Smith chart shown in FIG. 17. The Smith chart is normalized by the characteristic impedance 50 $\Omega$ of the power supply system.

The point A represents the characteristic impedance (50 $\Omega$) of the power supply system including the radio frequency generator 1 and the coaxial cable 1A at the input site of the matching circuit 2C. The point B represents the shift of the impedance caused by the resistor 101, and the point C represents the shift of the impedance caused by the inductor 102. Similarly, the point D represents the shift of the impedance caused by a load capacitor 106, the point E represents the shift of the impedance by a resistor 103, and the point F represents the shift of the impedance by an inductor 104.

In the Smith chart shown in FIG. 17, the point G represents the final output impedance of the matching circuit 2C. Since this final output impedance has a conjugate complex value with respect to the load impedance of the plasma processing chamber CN, the impedance Z1* at the point G is 3.6 $\Omega$-j1.4 $\Omega$, wherein the impedance Z1* is the conjugate complex impedance of the impedance Z1. Thus, the final impedance matching from the point A to the point G is achieved by the shift from the point F to point G by the tuning capacitor 105.

Since the actual impedance Z1 depends on the type of the plasma treatment and operating conditions, all of which are unknown at the time the circuit is designed, the inductor 104 is provided with a large adjustable range so that the adjustable range of the tuning capacitor 105 (i.e., the distance between the point E and the point F) becomes correspondingly larger. As a result, the parasitic resistor 103 of the inductor 104 has a large resistance of 2.72 $\Omega$, resulting in inefficient power consumption. A large resistance of the parasitic resistor 103 causes a shift of the impedance at the connection P in FIG. 16 from the point E on arc E-G to the point D.

A change in the impedance from the point C to the point D requires that the load capacitor 106 have a large capacitance value. Since a large current flows through the load capacitor 106, a large current loss occurs in the matching circuit (an increase in fed current loss). Accordingly, a current flowing in the resistor 101 also increases in the conventional matching circuit for the same reasons, and thus much power is consumed in the resistor 101. Consequently, a large amount of electric power is consumed in the resistor 101 and the parasitic resistor 103 of the matching circuit.

A variable inductor having a movable terminal is used in place of the inductor 104 for solving the above problem. If the variable inductor has high contact resistance at the connection of the terminal, large heat is generated at the connection due to large electrical loss. Such heat generation would cause damage of the inductor.

Furthermore, the variable range of the inductor is not optimized nor fixed. Thus, the inductance, which typically varies during maintenance, must be readjusted. In addition, the shift of the terminal on the inductor coil inhibits fine adjustment of the impedance between different plasma treatments. Moreover, the impedance Z0 and impedance Z1 of the plasma processing chamber are unknown after the adjustment, as in the conventional plasma treatment apparatus.

SUMMARY OF THE INVENTION

Objects of the present invention include the following:
(1) to provide a plasma processing apparatus that rapidly reaches an ideal plasma discharge state after electric power is supplied for plasma discharge;
(2) to provide a matching circuit that is optimized with respect to the impedance Z0 and the impedance Z1 for each plasma treatment;
(3) to enable a manufacturer of the matching circuit to obtain the impedance Z0 and the impedance Z1 through communication means;
(4) to monitor the impedance Z0;
(5) to reduce circuit loss due to parasitic RF resistance of passive devices of the matching circuit; and
(6) to reduce energy loss due to mismatching of the matching circuit in the design and production stages of the matching circuit.

A plasma processing apparatus according to the present invention includes a radio frequency generator; a plasma processing chamber; a matching circuit for impedance matching between the radio frequency generator and the plasma processing chamber; and matching circuit adjusting means for matching the output impedance of the matching circuit to the impedance of the plasma processing chamber in a nondischarge state.

For example, in one embodiment the impedance Z0 before discharge of the plasma processing chamber is stored in a memory unit. When RF power is supplied from the radio frequency generator, the matching circuit adjusting means adjusts the devices in the matching circuit based on the impedance Z0 stored in the memory unit. Thus, the impedance of the plasma processing chamber before the plasma discharge can be readily adjusted. By using these techniques, the productivity of the plasma treatment is improved. Furthermore, the unevenness of the thickness at the initial deposition stage of a film deposition process can be reduced.

The plasma processing apparatus of the present invention may further include discharge-detecting means for detecting the start of the discharge in the plasma processing chamber, wherein upon the detection of the start of the discharge by the discharge-detecting means the matching circuit adjusting means matches the output impedance of the matching circuit to the impedance of the plasma processing chamber.

When the discharge-detecting means detects the start of the discharge in the plasma processing chamber, the matching circuit adjusting means changes the output impedance of the matching circuit to match the impedance of the plasma processing chamber, i.e., from $Z0$ before discharge to $Z1$ after discharge. In other words, the plasma processing chamber rapidly reaches a stable discharge state. Thus, the output impedance of the matching circuit can be rapidly adjusted after the plasma discharge. Accordingly, the productivity of the plasma treatment is improved. Furthermore, the unevenness of the thickness at the initial deposition stage of a film deposition process can be reduced.

In the plasma processing apparatus according to the present invention, the plasma processing chamber preferably has a measuring terminal for measuring the impedance of the plasma processing chamber before discharge. The impedance before discharge can always be measured through the measuring terminal. The impedance measured is stored in the memory unit. When the impedance before discharge varies over time, the impedance stored in the memory unit is updated. As a result, the impedance before discharge can be rapidly adjusted. Thus, the productivity of the plasma treatment is improved.

A method for operating a plasma processing apparatus according to the present invention includes a first matching circuit adjusting step of matching an output impedance of a matching circuit to an impedance of the plasma processing chamber before discharge; a power feeding step of feeding RF power to the plasma processing chamber; a discharge detecting step of detecting discharge by the RF power in the plasma processing chamber; and a second matching circuit adjusting step of matching the output impedance of the matching circuit to the impedance of the plasma processing chamber during the discharge.

The matching circuit is adjusted in the first and second matching circuit adjusting steps based on the impedance $Z0$ before discharge and the impedance $Z1$ after discharge. Using these techniques, the time for adjusting the impedance from the start of discharge to a stable plasma discharge state can be significantly reduced. Thus, the productivity of the plasma treatment is improved.

A plasma processing method according to the present invention comprises a first matching circuit adjusting step of matching an output impedance of a matching circuit to an impedance of the plasma processing chamber before discharge; a power feeding step of feeding RF power to the plasma processing chamber; a discharge detecting step of detecting discharge by the RF power in the plasma processing chamber; and a second matching circuit adjusting step of matching an output impedance of the matching circuit to an impedance of the plasma processing chamber during the discharge.

For example, devices constituting the matching circuit are adjusted in the first matching circuit adjusting step based on the impedance $Z0$ of the plasma processing chamber before discharge, and in the second matching circuit adjusting step the matching circuit impedance is adjusted after detection of plasma discharge to the impedance $Z1$ of the plasma processing chamber during plasma discharge. Thus, the impedance of the plasma processing chamber can be rapidly adjusted before discharge. Thus, the productivity of the plasma treatment is improved. Furthermore, the unevenness of the thickness at the initial deposition stage can be reduced in a film deposition process.

A plasma processing apparatus according to the present invention includes a radio frequency generator; a plasma processing chamber; and a product matching circuit for impedance matching between the radio frequency generator and the plasma processing chamber. The product matching circuit is manufactured based on the determined circuit constant values for an adjusting matching circuit which is disposed between the radio frequency generator and the plasma processing chamber for a required plasma treatment. The circuit constant is determined by impedance matching between the radio frequency generator and the plasma processing chamber so that the adjusting matching circuit matches the load impedance of the plasma processing chamber.

In the plasma processing apparatus according to the present invention, the impedance $Z1$ of the plasma processing chamber is measured after a plasma is generated. The circuit constants such as an inductance of the tuning inductor of the matching circuit can thereafter be optimized by an algorithm using a Smith chart based on the impedance $Z1$. By using optimized values for the circuit constants, energy loss caused by mismatching of the matching circuit can be thereby reduced. Since the inductance of the tuning inductor is minimized in the optimized circuit, the parasitic RF resistance of the tuning inductor is also reduced. Thus, the loss of RF power in the matching circuit is reduced.

In the plasma processing apparatus of the present invention, a matching circuit having reduced circuit loss is produced specifically for a required plasma treatment. Such a matching circuit results in an increase in effective electric power supply to the plasma processing space in the plasma processing chamber in a plasma discharge state, an improvement in plasma treatment rate, and an improvement in productivity of device production in the apparatus.

A product matching circuit is installed when the impedance of the plasma processing chamber is varied by the change in process conditions such as accompanied by the change in products to be processed in the plasma chamber. Thus, the plasma processing apparatus always has a product matching circuit having reduced RF power loss.

In the plasma processing apparatus according to the present invention, the product matching circuit adjusts the impedance within a range that includes an impedance $Z0$ of the plasma processing chamber before plasma discharge and an impedance $Z1$ after plasma discharge. Since this range is significantly narrowed, the RF power loss in the matching circuit is significantly smaller than that in a conventional matching circuit having a wide adjusting range.

In the plasma processing apparatus, the plasma processing chamber preferably has a measuring terminal that measures the impedance $Z0$ of the plasma processing chamber. Thus, the impedance of the plasma processing chamber can be rapidly measured when the plasma treatment is changed. Since the impedance is monitored through the measuring terminal, the time for performing maintenance on the plasma processing chamber can readily be determined by detecting abnormal impedance.

A matching circuit designing system of a plasma processing apparatus includes an adjusting matching circuit of which the output impedance is controlled by adjusting an internal variable passive device; displacement measuring means for measuring the displacement of the variable passive device generated by drive means; reflected wave measuring means for measuring reflected waves of electric power supplied from a radio frequency generator when a plasma is discharged; drive control means for controlling the variable passive device by the drive means to minimize the reflected waves; computing means for calculating the impedance Z1 of the plasma processing chamber after the plasma is discharged, based on the displacement at the minimized reflected waves; and designing means for designing the circuit constant of the passive device constituting the product matching circuit based on the impedance Z1, wherein these means are connected through an information communication network by communication means.

An engineer of a company that designs matching circuits determines the impedance Z1 by the computing means based on the displacement that is obtained through the information communication network, calculates the circuit constant of the passive device constituting the matching circuit from the impedance Z1, and designs the product matching circuit.

Since the engineer can obtain the data for the impedance Z1 of the plasma processing chamber even though the chamber is remote from the engineer, the product matching circuit can be rapidly produced at reduced cost.

In the matching circuit designing system, the plasma processing chamber preferably includes impedance measuring means for measuring the impedance Z0 of the plasma processing chamber before plasma discharge and for outputting the impedance Z0 to the designing means. The engineer can optimize the adjustable range of the matching circuit based on the obtained impedances Z0 and Z1. Thus, the product matching circuit has significantly reduced RF power loss.

The matching circuit designing system preferably further includes memory means, for example a memory storage device, that is connected to the information communication network and stores the impedance Z0, the impedance Z1, and an identification number for the matching circuit. This provides advantages relating to scheduling maintenance of the plasma processing chamber since the impedance data can be read from the memory means and the engineer can rapidly respond to user questions regarding maintenance. Furthermore, the circuit constants corresponding to a past plasma treatment can be readily retrieved.

BRIEF DESCRIPTION OF THE DRAWINGS

FIG. 10 shows a memory format of data in a memory unit in FIG. 8;

FIG. 11 shows another memory format of data in the memory unit in FIG. 8;

DESCRIPTION OF THE PREFERRED EMBODIMENTS

First Embodiment

Figure 1:
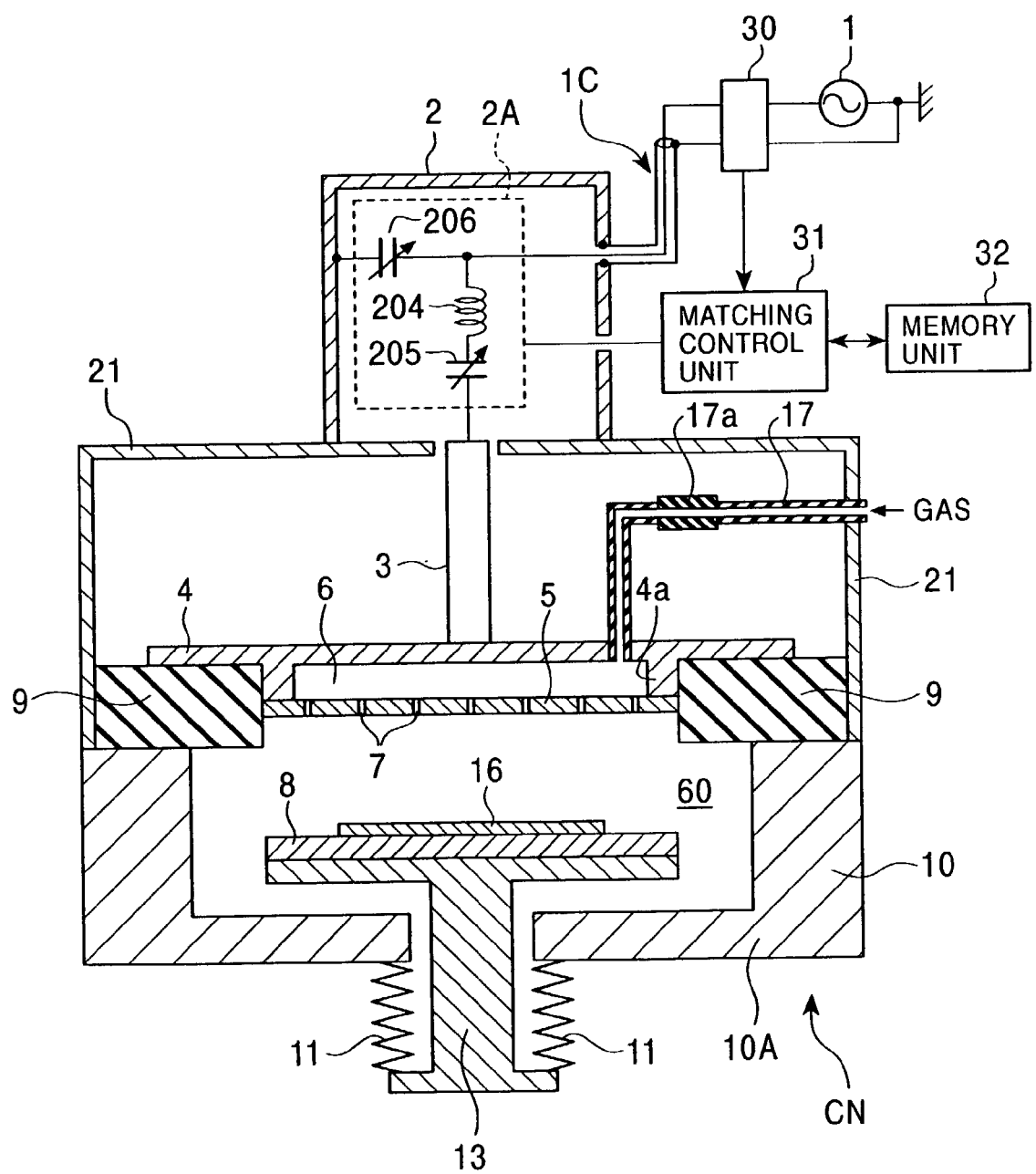
FIG. 1 is a schematic cross-sectional view of a plasma processing chamber unit of a plasma processing apparatus according to a first embodiment of the present invention.
Figure 15:
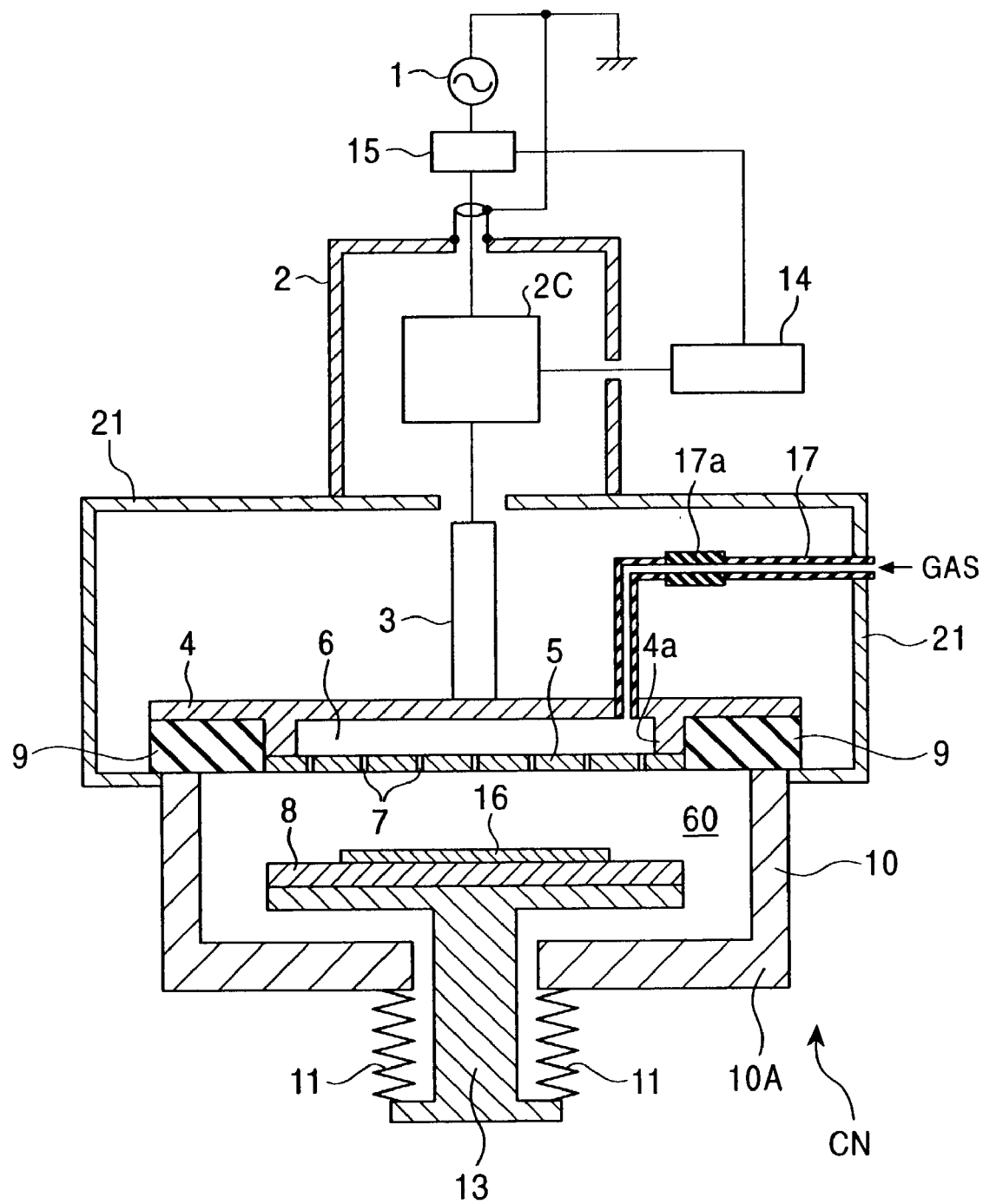
FIG. 15 is a cross-sectional view of a plasma processing chamber unit of a conventional plasma processing apparatus.

FIG. 1 is a schematic view of a plasma processing apparatus according to a first embodiment of the present invention. Parts having the same functions as in FIG. 15 are referred to with the same reference numerals, and a detailed description thereof with reference to drawings has been omitted.

The plasma processing apparatus of the first embodiment is of a single-frequency excitation type and is used for plasma treatments, such as chemical vapor deposition (CVD), sputtering, dry etching, and ashing. The plasma processing apparatus includes a plasma processing chamber CN having parallel plate electrodes 4 and 8 (a plasma excitation electrode 4 and a susceptor electrode 8), an RF generator 1 connected to the plasma excitation electrode 4 through a feed plate 3, and a matching circuit 2A that performs the impedance matching between the plasma processing chamber CN and the RF generator 1, the latter value represented by the characteristic impedance of a coaxial cable 1C.

More specifically, the plasma processing apparatus includes the plasma excitation electrode 4, connected to the RF generator 1, and a shower plate 5 at an upper position in the plasma processing chamber CN, and includes the susceptor electrode (counter electrode) 8 that holds a substrate 16 to be treated at a lower position. The shower plate 5 faces the susceptor electrode 8. The plasma excitation electrode 4 is connected to the RF generator 1 via a feed plate 3 and the matching circuit 2A. Both the plasma excitation electrode 4 and the feed plate 3 are covered with a chassis 21, and the matching circuit 2A is accommodated in a conductive matching box 2.

The feed plate 3 is a silver-plated copper plate having a width of 50 to 100 mm, a thickness of 0.5 mm and a length of 100 to 300 mm. The feed plate 3 is fastened by screws to the output terminal of a tuning capacitor 205 in the matching circuit 2A and the plasma excitation electrode 4.

The plasma excitation electrode 4 has a projection 4a at the bottom face, and a shower plate 5 having many holes 7 in contact with the projection 4a; hence, the plasma excitation electrode 4 and the shower plate 5 form a space 6 therebetween. The space 6 communicates with a gas inlet pipe 17 that extends through the sidewall of the chassis 21 and the plasma excitation electrode 4. The gas inlet pipe 17 is composed of a conductive material and provided with an insulator 17a in its middle portion located inside the chassis 21, for insulating the plasma excitation electrode 4 from the gas supply source.

Gas from the gas inlet pipe 17 is supplied into the plasma processing space 60 defined by a chamber wall 10 through the many holes 7 of the shower plate 5. The chamber wall 10 is insulated from the plasma excitation electrode 4 by an insulator 9. The susceptor electrode 8 in the plasma processing space 60 holds the substrate 16.

The susceptor electrode 8 is supported by a shaft 13 that extends through a chamber bottom 10A. The lower portion of the shaft 13 is hermetically-connected to the chamber bottom 10A with a bellows 11 so that the susceptor electrode 8 and the shaft 13 can be vertically moved to adjust the distance between the parallel plate electrodes 4 and 8. As a result of the connection between the susceptor electrode 8 and the shaft 13, the susceptor electrode 8, the shaft 13, the bellows 11, the chamber bottom 10A, and the chamber wall 10 have the same DC potential. Also as a result of the connection between the chamber wall 10 and the chassis 21, the chamber wall 10, the chassis 21, and the matching box 2 have the same DC potential.

The matching circuit 2A includes a plurality of passive devices for adjusting the impedance of the plasma processing chamber CN in response to, for example, a change in plasma state in the plasma processing chamber CN. The matching circuit 2A is disposed between the RF generator 1 and the feed plate 3 and includes a tuning inductor 204 and a tuning capacitor 205 connected in series, and includes a load capacitor 206. One end of the load capacitor 206 is connected to the end of the tuning inductor 204 whereas the other end of the load capacitor 206 is connected to the matching box 2.

The tuning capacitor 205 is connected to the plasma excitation electrode 4 via the feed plate 3. The matching box 2 is connected to a shield line of the coaxial cable 1C that is DC-grounded. Thus, the wafer susceptor 8, the shaft 13, the bellows 11, the chamber bottom 10A, the chamber wall 10, the chassis 21, and the matching box 2 are set to the ground potential. Hence, one end of the load capacitor 206 is DC-grounded.

In the plasma processing apparatus according to the first embodiment, RF power with a frequency of at least 13.56 MHz, for example, 13.56 MHz, 27.12 MHz, or 40.68 MHz, is fed to generate a plasma between the parallel plate electrodes 4 and 8 for performing plasma treatment, for example, chemical vapor deposition (CVD), dry etching, or ashing on the substrate 16 on the susceptor electrode 8.

The RF power is fed from the RF generator 1 to the feeding path including the coaxial cable 1C, the matching circuit 2A, the feed plate 3, and the plasma excitation electrode 4. The RF current from these components flows through the plasma processing space 60, the susceptor electrode 8, the shaft 13, the bellows 11, the chamber bottom 10A, the chamber wall 10, the chassis 21, the matching box 2, and the coaxial cable 1C toward the ground of the RF generator 1.

Next, several of the main components of the present invention, i.e., a reflected wave detector 30, a matching control unit 31, and a memory unit 32, which are disposed near the matching box 2, will be described in detail.

The radio frequency generator 1 supplies RF power for plasma discharge to the plasma processing chamber CN via the reflected wave detector 30 and the matching box 2.

The matching circuit 2A is disposed in the matching box 2 for matching the output impedance of the radio frequency generator 1 with the load impedance of the plasma processing chamber CN. The matching circuit 2A includes the load capacitor 206, the tuning inductor 204, and the tuning capacitor 205.

Both the load capacitor 206 and the tuning capacitor 205 are variable capacitors that are driven with motors (not shown in the drawing). The matching control unit 31 controls the rotation of motors to adjust the capacitances of the variable capacitors (the tuning capacitor 205 and the load capacitor 206). The memory unit 32 stores observed impedances Z0 and Z1, which have preliminarily been measured.

The impedance Z0 can be measured with an impedance meter after first detaching the matching circuit 2A from the plasma processing chamber.

In a matched state reached after the plasma discharge starts, the matching circuit 2A is detached from the plasma processing chamber, a dummy load of 50 Ω is connected instead of the radio frequency generator, and the impedance Z1* is measured at the output terminal of the matching circuit 2A with the impedance meter.

In the matched state, the impedance Z1 can be preliminarily measured by using the complex conjugate relationship between the impedance Z1* and the impedance Z1.

An example of the use of the impedance meter for measuring the impedance Z0 will now be described.

Figure 3:
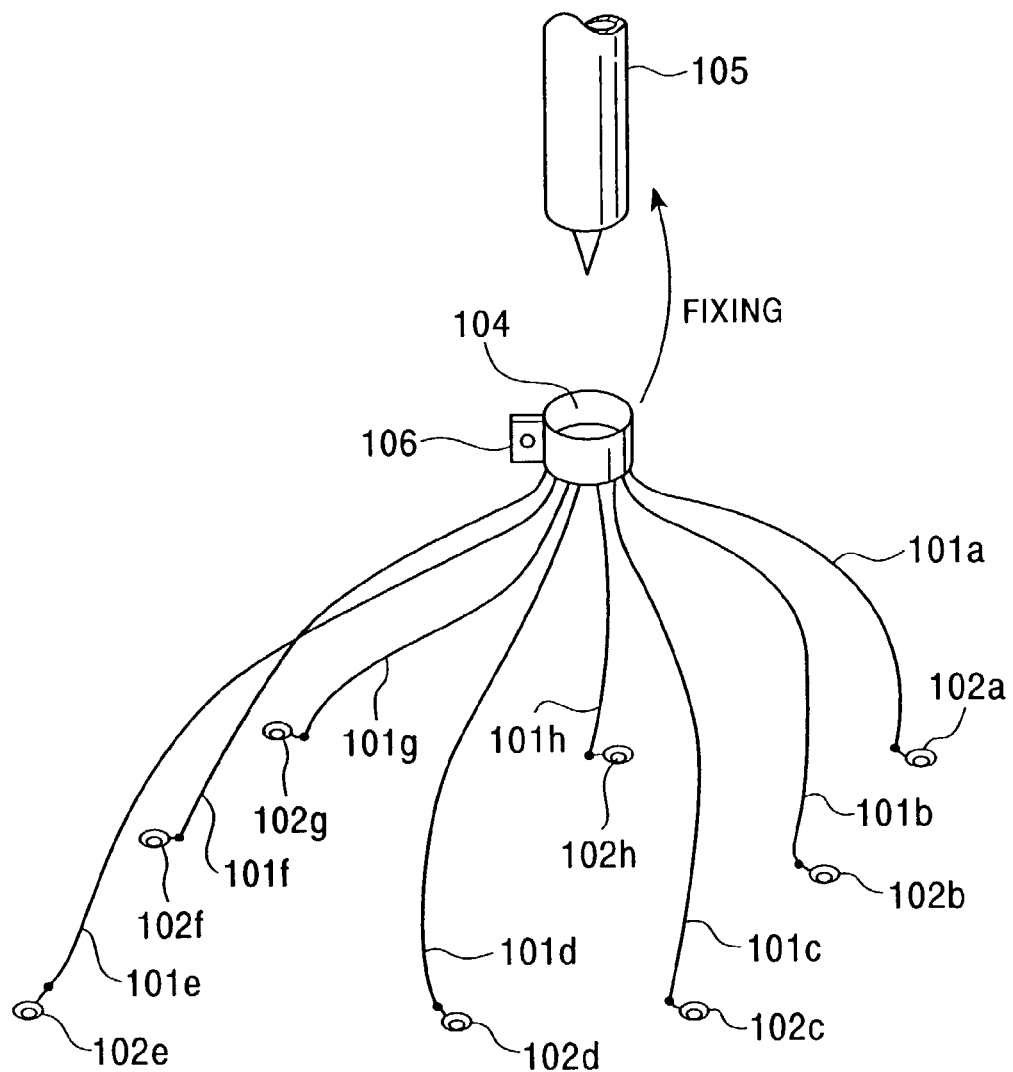
FIG. 3 is an outline view of an impedance meter.

FIG. 3 is a schematic view of a fixture connected to the plasma processing chamber CN for measuring the impedance. The fixture has a probe attachment 104 and a plurality of conductive wires 101a to 101h having the same impedance, one end of each of the conductive wires 101a to 101h being connected to the probe attachment 104.

The probe attachment 104 is formed, for example, by shaping a 50 mm×10 mm×0.5 mm copper plate into a clamping portion 106 and a ring portion. The diameter of the ring portion is determined so that the ring portion is attachable to the circumference of a probe 105. One end of each of the conductive wires 101a to 101h is soldered to the probe attachment 104 for electrical connection.

Terminals 102a to 102h that are attachable to and detachable from an object to be measured are provided at the other ends of the conductive wires 101a to 101h.

Figure 4:
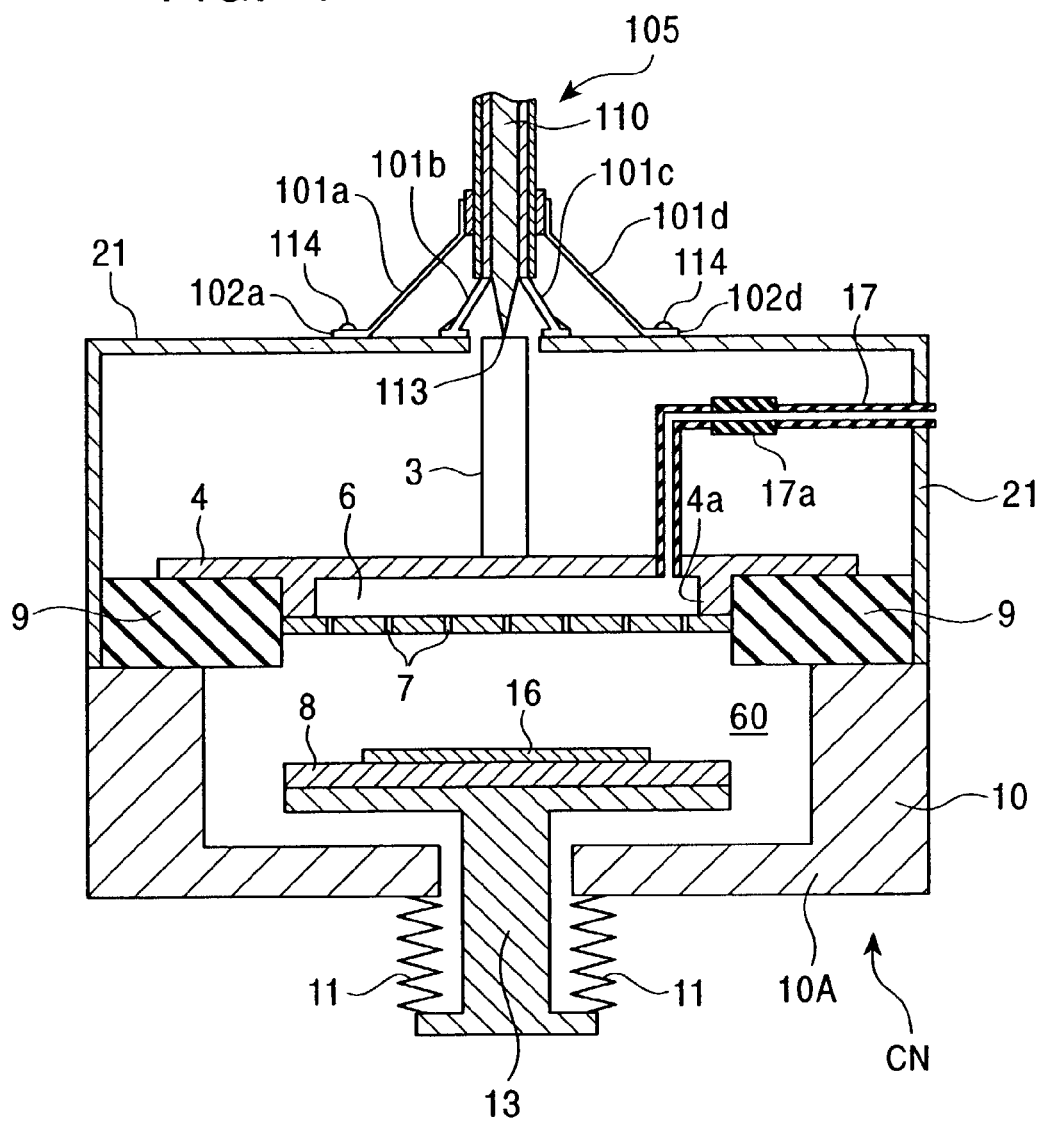
FIG. 4 is a cross-sectional view illustrating a method for measuring the impedance of the plasma processing chamber CN shown in FIG. 1 using the impedance meter shown in FIG. 3.

In use of this fixture, the probe 105 is inserted into the ring portion of the probe attachment 104, and the probe attachment 104 is clamped around the probe 105 with the clamping portion 106. The conductive wires 101a to 101h are detachably screwed to the measured object in a substantially symmetrical manner about a point by using the terminals 102a to 102h, as shown in FIG. 4.

Figure 5:
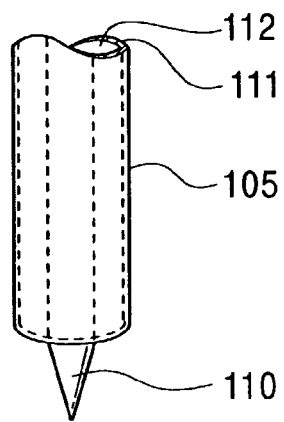
FIG. 5 is an outline view of a probe of the impedance meter.

Referring to FIG. 5, the probe 105 includes a conductive line 110, an insulating cover 112 around the conductive line 110, and an outer conductor 111 around the insulating cover 112. The probe 105 is connected to an impedance meter (not shown) with a coaxial cable.

The conductive wires 101a to 101h may be composed of, for example, aluminum, copper, silver, or gold, or may be plated by silver or gold having a thickness of 50 μm or more.

The fixture has conductive wires that are attached to the ground of the probe 105 and have a length corresponding to the size of the object to be measured (for example, the plasma processing chamber CN in this embodiment) and the distance between two points to be measured.

The matching control unit 31 controls the capacitance of the load capacitor 206 so that the impedance is adjusted to Z0 or Z1. In this case, the variation in the load capacitor 206 corresponds to, for example, a variation D0 (for the impedance Z0) or D1 (for the impedance Z1) in the amount and direction of the rotation of the motor.

Similarly, the variation in the tuning capacitor 205 corresponds to, for example, a variation E0 (for the impedance Z0) or E1 (for the impedance Z1) in the amount and direction of the rotation of the motor.

That is, the variations D0 and E0 indicate the displacements from the reference positions of the variable load capacitor 206 and the variable tuning capacitor 205, respectively. The variations D1 and E1, respectively, indicate the displacements from the initial displacements (i.e., the displacements corresponding to the variations D0 and E0 and corresponding to plasma chamber impedance Z0) of the load capacitor 206 and the tuning capacitor 205.

After the plasma treatment is completed, the matching control unit 31, the load capacitor 206 and the tuning capacitor 205 are restored to their reference positions by the adjusting shafts driven by the motors.

Before plasma discharge, the matching control unit 31 drives the adjusting shafts of the load capacitor 206 and the tuning capacitor 205 to adjust the output impedance of the matching circuit 2A to Z0, based on the variations D0 and E0, respectively.

After adjustment of the output impedance to Z0, the reflected wave detector 30 detects reflected waves from the plasma discharge, and the matching control unit 31 drives the adjusting shafts of the load capacitor 206 and the tuning capacitor 205 to adjust the output impedance of the matching circuit 2A to Z1, using the variations D1 and E1, respectively.

After adjustment of the output impedance to Z0 or Z1, the matching control unit 31 tunes the load capacitor 206 and the tuning capacitor 205 of the matching circuit 2A so that the electric power (for example, spurious electric power) of the reflected waves that are detected by the reflected wave detector 30 is minimized.

Figure 2:
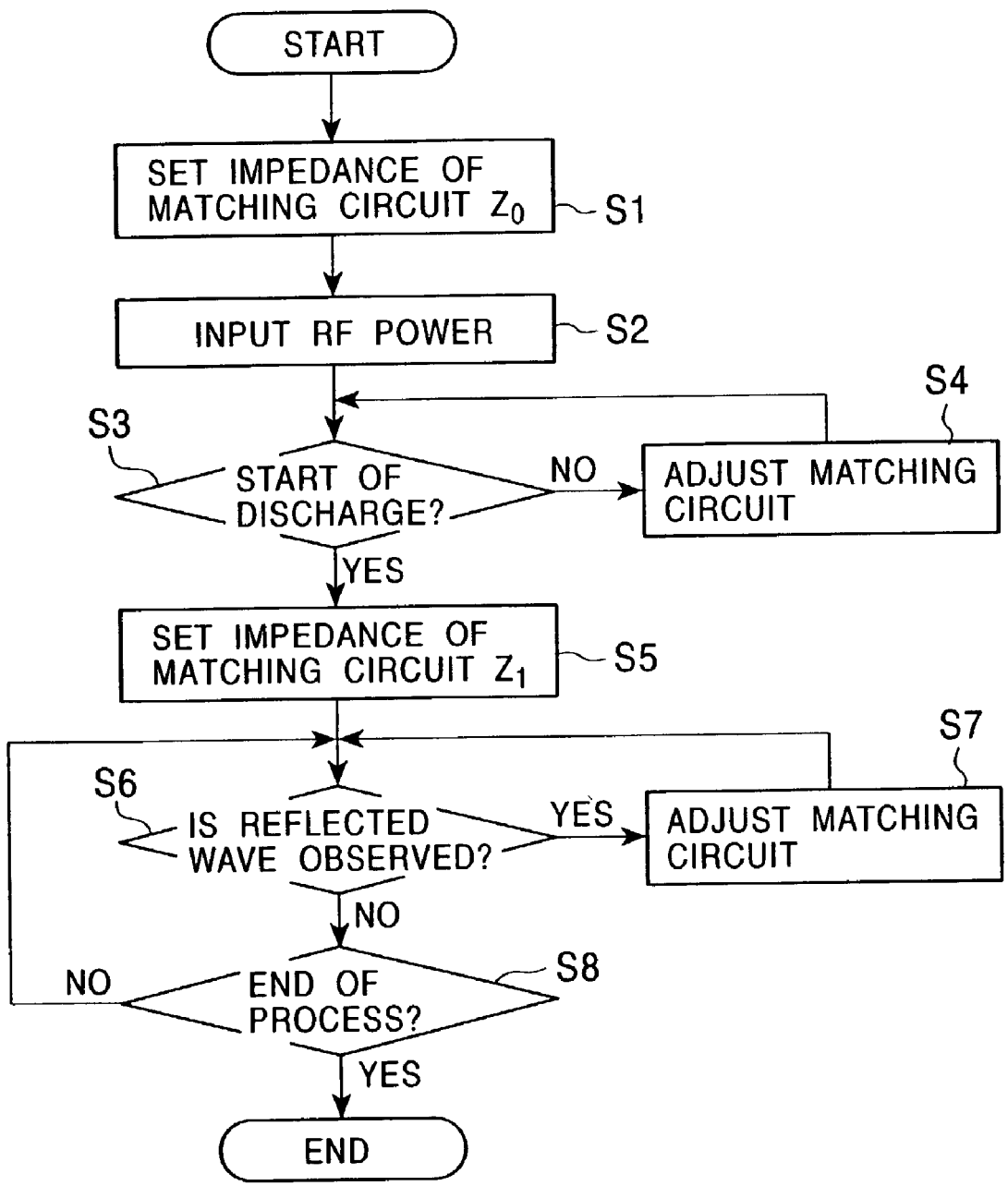
FIG. 2 is a flow chart of an operation of a matching control unit of the plasma processing apparatus shown in FIG. 1.

Referring to FIGS. 1 and 2, the operation of this embodiment will now be described. FIG. 2 is a flow chart illustrating the operation of the plasma processing apparatus shown in FIG. 1.

In Step 1 (S1), an operator places a substrate 16 to be treated into the plasma processing chamber CN, and throws a switch for starting the plasma treatment. The matching control unit 31 adjusts the output impedance of the matching circuit 2A to Z0 based on the variations D0 and E0 that are stored in the memory unit 32.

In Step 2 (S2), RF power is supplied from the radio frequency generator 1 to the plasma processing chamber CN.

In Step 3 (S3), the matching control unit 31 determines whether the intensity of the reflected waves as detected by the reflected wave detector 30 exceeds a predetermined threshold. For example, the threshold may preliminarily be set to 90% of the intensity of the reflected waves when the plasma discharge starts.

If the intensity of the detected signal exceeds the threshold, the matching control unit 31 determines that the plasma discharge has commenced and proceeds to Step 5 (S5). If the intensity of the detected signal does not exceed the threshold, the matching control unit 31 determines that the plasma discharge has not commenced and proceeds to Step 4 (S4)

In Step 4 (S4), the matching control unit 31 tunes the output impedance of the matching circuit 2A by finely adjusting the capacitance of the load capacitor 206 and the capacitance of the tuning capacitor 205. The output impedance is varied by a given increment or decrement from the impedance Z0. After S4, the procedure is returned to S3 to determine whether the plasma discharge has started. When S4 is re-executed, the increment or decrement is increased compared with that in the previous step. Thus, changes in the impedance Z0 of the matching circuit occurs in an incremental fashion.

In Step 5 (S5), the output impedance of the matching circuit 2A is adjusted to the impedance Z1 based on the variations D1 and E1 that are stored in the memory unit 32.

In Step 6 (S6), the matching control unit 31 determines whether the intensity of the detected signal as detected by the reflected wave detector 30 exceeds a predetermined discharge threshold. For example, the discharge threshold is preliminarily set to the intensity of the reflected waves when the plasma discharge starts in the matched impedance (the output impedance of the matching circuit 2A=Z1).

If the intensity of the detected signal does not exceed the discharge threshold, the matching control unit 31 determines that the plasma discharge is in an ideal state and operation proceeds to Step 8 (S8). If the intensity of the detected signal exceeds the discharge threshold, the matching control unit 31 determines that the plasma discharge is not in an ideal state and the operation proceeds to Step 7 (S7).

In Step 7 (S7), the matching control unit 31 tunes the output impedance of the matching circuit 2A by finely adjusting the capacitance of the load capacitor 206 and the capacitance of the tuning capacitor 205. The output impedance is varied by a given increment or decrement from the impedance Z1. After S7, the procedure is returned to S6 to reevaluate the intensity of the reflected waves. When S7 is re-executed, the increment or decrement is increased compared with that in the previous step.

After a predetermined time is elapsed, in Step 8 (S8), the matching control unit 31 detects whether the plasma treatment is completed or whether the operator terminates the operation.

If the matching control unit 31 detects the completion of the process, the supply of power is interrupted. If the matching control unit 31 does not detect the completion of the plasma treatment, the operation proceeds to S6.

As described above, in the plasma processing apparatus according to the first embodiment, the memory unit 32 stores the impedance Z0, i.e., the load impedance before plasma discharge. Before RF power is fed from the radio frequency generator 1, the matching control unit 31 adjusts the output impedance of the matching circuit 2A to Z0 by adjusting the capacitance of the load capacitor 206 and the capacitance of the tuning capacitor 205. Thus, the adjustment of the output impedance to the impedance Z0 and feeding of the RF power can be readily performed. Since the preparatory time required for plasma discharge is reduced, productivity of the plasma treatment is improved.

After the discharge starts, the matching control unit 31 matches the output impedance of the matching circuit 2A to the impedance Z1. Since the output impedance of the matching circuit 2A is readily varied from Z0 to Z1, the preparatory time required for stable plasma discharge is reduced, and the productivity of the plasma treatment is improved.

A method for operating the plasma processing apparatus includes a first matching circuit adjusting step of matching the output impedance of the matching circuit 2A to the impedance Z0 of the plasma processing chamber CN before discharge; a power feeding step of feeding RF power to the plasma processing chamber CN; a discharge detecting step of detecting the discharge in the plasma processing chamber CN by the RF power; and a second matching circuit adjusting step of matching the output impedance of the matching circuit 2A to the impedance Z1 of the plasma processing chamber during the discharge. In the first and second matching circuit adjusting steps, the output impedance of the matching circuit 2A is adjusted to the impedance Z0 before the discharge based on the variations D0 and E0 and to the impedance Z1 after the discharge based on the variations D1 and E1. Thus, the preparatory time from the generation of RF power to the start of the discharge and the preparatory time from the start of the discharge to the stable plasma discharge state are significantly reduced, resulting in improved plasma processing productivity.

Second Embodiment

Figure 6:
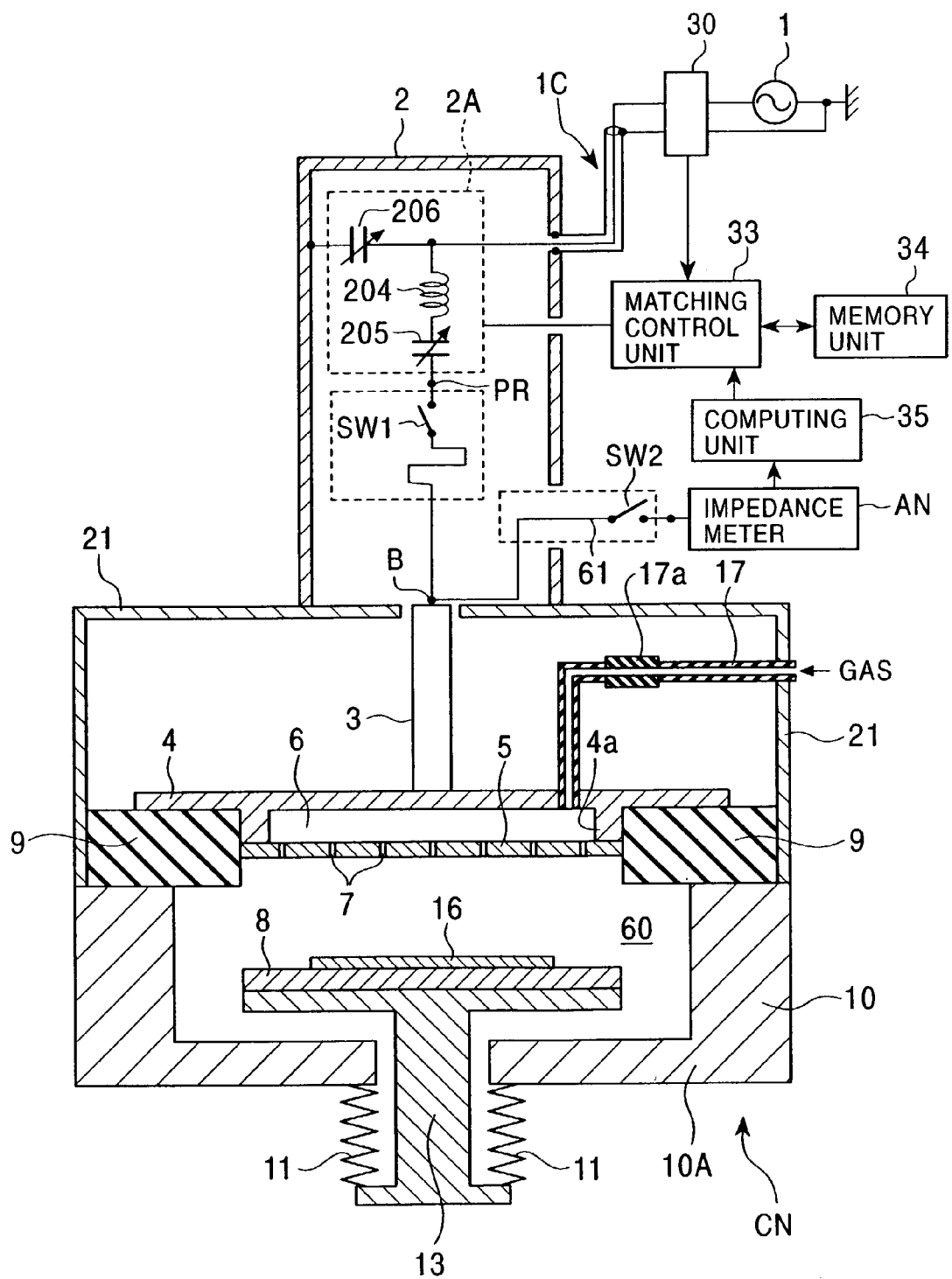
FIG. 6 is a schematic cross-sectional view of a plasma processing chamber unit of a plasma processing apparatus according to a second embodiment of the present invention.

FIG. 6 is a schematic view of a plasma processing apparatus according to a second embodiment of the present invention. Parts having the same functions as in FIG. 1 are referred to with the same reference numerals, and a detailed description thereof with reference to drawings has been omitted.

Selected main components in the present invention, i.e., a reflected wave detector 30, a matching control unit 33, a memory unit 34, and a computing unit 35, which are disposed in the vicinity of a matching box 2, will now be described in detail.

A radio frequency generator 1 supplies RF power for plasma discharge to a plasma processing chamber CN via the reflected wave detector 30 and the matching box 2.

A matching circuit 2A is disposed in the matching box 2 for matching the output impedance of the radio frequency generator 1 with the load impedance of the plasma processing chamber CN. The matching circuit 2A includes a load capacitor 206, a tuning inductor 204, and a tuning capacitor 205.

Both the load capacitor 206 and the tuning capacitor 205 are variable capacitors that are driven with motors (not shown in the drawing). The matching control unit 33 controls the rotation of motors to adjust the capacitances of the variable capacitors (the tuning capacitor 205 and the load capacitor 206). The memory unit 34 stores observed impedances Z0 and Z1, which have preliminarily been measured.

The matching control unit 33 controls the capacitance of the load capacitor 206 so that the impedance is adjusted to Z0 or Z1. In this case, the variation in the load capacitor 206 corresponds to, for example, a variation D0 (corresponding to the impedance Z0) or D1 (corresponding to the impedance Z1) in the amount and direction of the rotation of the motor.

Similarly, the variation in the tuning capacitor 205 corresponds to, for example, a variation E0 (corresponding to the impedance Z0) or E1 (corresponding to the impedance Z1) in the amount and direction of the rotation of the motor.

That is, the variations D0 and E0 indicate the displacements from the reference positions of the load capacitor 206 and the tuning capacitor 205, respectively. The variations D1 and E1, respectively, indicate the displacements of the load capacitor 206 and the tuning capacitor 205 from the initial displacement positions (i.e., the displacements corresponding to the variations D0 and E0).

After the plasma treatment is completed, the matching control unit 33, the load capacitor 206 and the tuning capacitor 205 are restored to their reference positions by the motors.

Before plasma discharge, the matching control unit 33 drives the adjusting shafts of the load capacitor 206 and the tuning capacitor 205 to adjust the output impedance of the matching circuit 2A to Z0, based on the variations D0 and E0, respectively.

After adjustment of the output impedance to Z0, the reflected wave detector 30 detects reflected waves from plasma discharge, and the matching control unit 33 drives the motor of the load capacitor 206 and the tuning capacitor 205 to adjust the output impedance of the matching circuit 2A to Z1, based on the variations D1 and E1, respectively.

After adjustment of the output impedance to Z0 or Z1, the matching control unit 33 fine tunes the load capacitor 206 and the tuning capacitor 205 of the matching circuit 2A so that the electric power (for example, spurious electric power) of the reflected waves that are detected by the reflected wave detector 30 is minimized.

The matching control unit 33 also updates the stored values for variations D1 and E1 on the load capacitor 206 and the tuning capacitor 205, respectively, in the memory unit 34. That is, variations D1 and E1 of the load capacitor 206 and the tuning capacitor 205, representing a variation needed to move from a displacement corresponding to the impedance Z0 to a displacement corresponding to the impedance Z1, are updated.

After the supply of power from the radio frequency generator 1 is interrupted upon the completion of the plasma treatment, the load impedance Z0 of the plasma processing chamber CN in a nondischarge state is measured by the impedance meter AN.

The computing unit 35 calculates the variations D0 and E0 from the impedance Z0, using, for example, a function or table showing the relationship between the impedance and the positions of the load capacitor 206 and the tuning capacitor 205.

The matching control unit 33 then updates the variations D0 and E0 in the memory unit 34.

Figure 7:
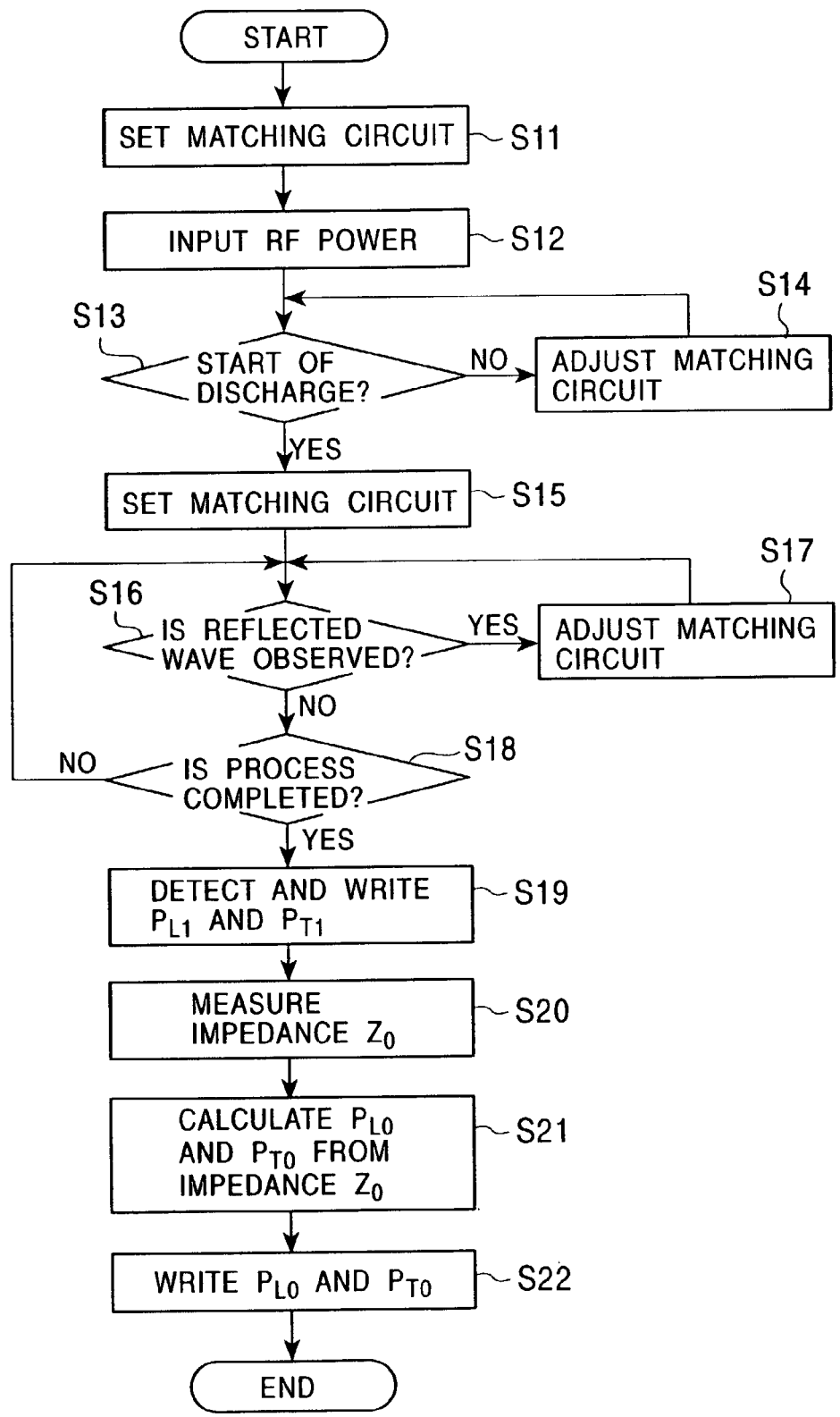
FIG. 7 is a flow chart of an operation of a matching control unit of the plasma processing apparatus shown in FIG. 6.

Referring to FIGS. 6 and 7, the operation of the second embodiment will now be described. FIG. 7 is a flow chart illustrating the operation of the plasma processing apparatus shown in FIG. 6.

Steps 11 to 17 (S11 to S17) correspond to S1 to S7 in the first embodiment, and further description here is therefore omitted. In these steps, the matching control unit 33 and the memory unit 34 have the same operation as that of the matching control unit 31 and the memory unit 32 as described with reference to FIGS. 1 and 2.

In Step 18 (S18), the matching control unit 33 detects whether the plasma treatment is completed or whether the operator terminates the operation, after a predetermined time has elapsed.

If the matching control unit 33 detects the completion of the process, the power supplied from the radio frequency generator 1 is interrupted, and the operation proceeds to S19. If the matching control unit 33 does not detect the completion of the process, the operation proceeds to S16.

In Step 19 (S19), the matching control unit 33 detects the variations of the load capacitor 206 and the tuning capacitor 205 from the positions at the impedance Z0 to the positions at the impedance Z1. The computing unit 35 overwrites the detected variations onto the variations D1 and E1 in the memory unit 34. In other words, the variations D1 and E1 in the memory unit 34 are updated.

In Step 20 (S20), the impedance meter AN measures the load impedance Z0 of the plasma processing chamber CN, i.e., the load impedance in the absence of plasma discharge. In the measurement mode, the switch SW1 of the impedance meter AN is turned off while the switch SW2 is turned on during measurement of the impedance Z0. In contrast, the switch SW1 is turned on while the switch SW2 is turned off during the plasma treatment. The impedance between the switch SW1 and point B in FIG. 6 is the same as that between the switch SW2 and point B.

In Step 21 (S21), the computing unit 35 calculates the variations D0 and E0 based on the impedance Z0 measured.

In Step 22 (S22), the computing unit 35 overwrites the calculated variations D0 and E0 onto the stored values for variations D0 and E0 in the memory unit 34. In other words, the variations D0 and E0 in the memory unit 34 are updated.

Then, the switch SW1 of the impedance meter AN is turned on while the switch SW2 is turned off, and the plasma treatment in the plasma processing apparatus is completed.

The plasma processing apparatus of the second embodiment has a measuring terminal 61 for measuring the impedance Z0 of the plasma processing chamber CN before discharge. The impedance Z0 of the plasma processing chamber CN is measured through the measuring terminal 61 at a predetermined time interval or when the plasma treatment is completed, and the variations D0 and E0 in the memory unit 34 are updated based on the measured impedance Z0. Thus, the capacitances of the load capacitor 206 and the tuning capacitor 205 can be readily adjusted before the start of plasma discharge such that the impedance of the matching circuit output is Z0. Since the time from the feed of the RF power to the start of the plasma discharge is reduced, the productivity of the plasma treatment is improved.

Third Embodiment

Figure 8:
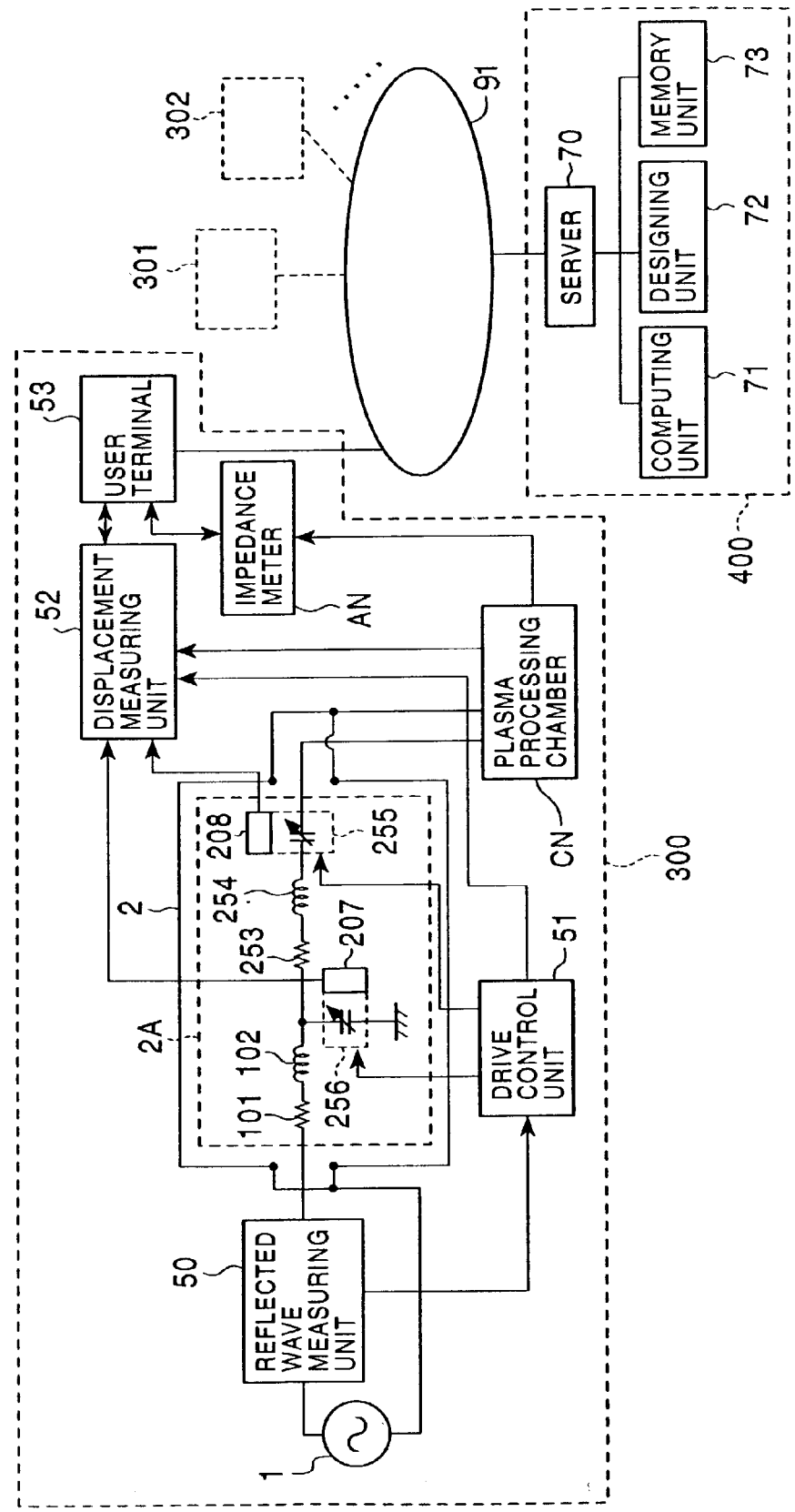
FIG. 8 is a schematic view of a matching circuit designing system of a plasma processing apparatus according to the present invention.

FIG. 8 is a schematic diagram of a configuration of a matching apparatus designing system for a plasma processing apparatus according to a third embodiment. In the drawing, the structure of the matching circuit 2A of the matching circuit 2A in the matching box 2 is illustrated.

In this embodiment, the plasma processing apparatus is placed at an operation site 300. A matching circuit 2A (FIG. 8) or 2B (FIG. 9) is provided between the plasma processing chamber CN and the radio frequency generator 1 of the plasma processing apparatus.

In the initialization process of the plasma processing apparatus, the matching circuit 2A is used for adjustment. Impedance matching is performed with a drive control unit 51, a reflected wave measuring unit 50, and a displacement-measuring unit 52. The displacement of the matching circuit 2A at the impedance matched state is transmitted from a user terminal 53 to a server 70 at a manufacturer 400 of the matching circuit 2A, for example through a communication line 91.

The server 70 outputs the displacement to a computing unit 71 that calculates the impedance Z1 based on the displacement. A designing unit 72 calculates parameters (circuit constants) of components constituting the product matching circuit 2B, based on the impedance Z1. An operator of the manufacturer 400 assembles the matching circuit 2B based on the calculated circuit constants and sends it to the operation site 300. An operator at the operation site 300 exchanges the matching circuit 2A with the matching circuit 2B and starts the production using the plasma processing apparatus.

More specifically, the radio frequency generator 1 supplies RF power for plasma discharge to the plasma processing chamber CN through the matching box 2. The matching circuit 2A in the matching box 2 matches the output impedance of the radio frequency generator 1 to the load impedance of the plasma processing chamber CN. The matching circuit 2A provides adjustment to correspond to the impedance Z1 of the plasma processing chamber.

The drive control unit 51 adjusts a load capacitor 256 and a tuning capacitor 255 so that the electric power (for example spurious electric power) of the reflected waves detected by the reflected wave measuring unit 50 is minimized. The reflected wave measuring unit 50 is disposed between the matching box 2 and the radio frequency generator 1.

Both the load capacitor 256 and the tuning capacitor 255 are variable capacitors that are driven with adjusting shafts connecting to motors (not shown in the drawing). The drive control unit 51 controllably drives the adjusting shafts of the variable load capacitor 256 and the variable tuning capacitor 255 in an amount and direction of the rotation of each motor to adjust the capacitances of these capacitors.

Before shipping of the matching circuit 2A, the load capacitor 256 and the tuning capacitor 255 are set by the manufacturer 400 of the matching circuit to have initial capacitances that correspond to the impedance Z0 of the plasma processing chamber CN. For example, a manufacturer of a plasma processing apparatus (not shown) in one embodiment has preliminarily transmitted the data of the impedance Z0 to the manufacturer 400 of the matching circuit through the communication line 91. If the manufacturer of the plasma processing apparatus does not have the data of the impedance Z0, the manufacturer 400 of the matching circuit 2A must empirically set an initial impedance Z0. Of course, this embodiment of the invention is not limited in scope to separate manufacturers. The plasma processing apparatus and the matching circuit can be produced by the same manufacturer.

A displacement meter 207 detects the displacement of the load capacitor 256 from the position corresponding to the impedance Z0 that is driven by the drive control unit 51, and the displacement-measuring unit 52 converts the displacement into displacement data D1. The displacement is for example, the amount and direction of the rotation of the motor.

Similarly, a displacement meter 208 detects the displacement of the tuning capacitor 255 from the position corresponding to the impedance Z0 that is driven by the drive control unit 51, and the displacement-measuring unit 52 converts the displacement into displacement data D2. The displacement is for example, the amount and direction of the rotation of the motor.

When the reflected electric power input from the reflected wave measuring unit 50 is minimized, the displacement-measuring unit 52 transmits the displacement data D1 and D2 and a control signal received from the drive control unit 51 to a user terminal 53.

The user confirms, on a screen of the user terminal 53, that the impedance matching between the radio frequency generator 1 and the plasma processing chamber CN by the matching circuit 2A is completed, and transmits the displacement data D1 and D2 to the server 70.

The server 70, which is connected to the user terminal 53 via the communication line 91, transmits and receives various data to and from the user terminal 53. The communication line 91 is, for example, a public line, a dedicated line, or the Internet.

The computing unit 71 located at the manufacturer 400 calculates the capacitances corresponding to the displacements of the load capacitor 256 and the tuning capacitor 255 based on the displacement data D1 and D2, respectively, which are received from the server 70.

According to this embodiment, the memory unit 73 stores the inductance of a tuning inductor 254, the resistance of a parasitic RF resistor 253 of the lower tuning inductor 254, the inductance of a parasitic inductor 102 of the feed line (a line between the input terminal of the matching circuit 2A or 2B and the connection of the load capacitor 256), and the resistance of a parasitic resistor 101 of the feed line, with the identification number of the matching circuit 2A.

The computing unit 71 calculates the differential capacitance corresponding to the displacement D1 of the load capacitor 256, using, for example, a predetermined function or a lookup table illustrating the relationship between the displacement and the capacitance. Thereafter, the capacitance (the sum of the initial capacitance and the differential capacitance) of the load capacitor 256 is determined for the impedance matched condition.

The computing unit 71 also calculates the differential capacitance corresponding to the displacement D2 of the tuning capacitor 255, using, for example, a predetermined function or a lookup table illustrating the relationship between the displacement and the capacitance. Thereafter, the capacitance (the sum of the initial capacitance at the impedance Z0 and the differential capacitance) is determined for the tuning capacitor 255 for the impedance matched condition.

Figure 16:
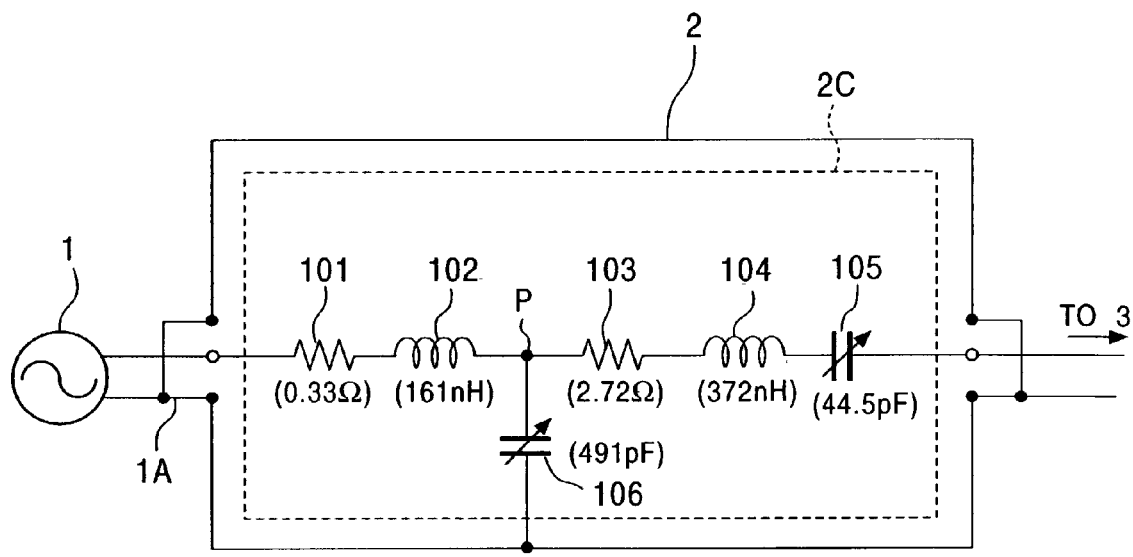
FIG. 16 is a schematic view of a conventional matching circuit.
Figure 17:
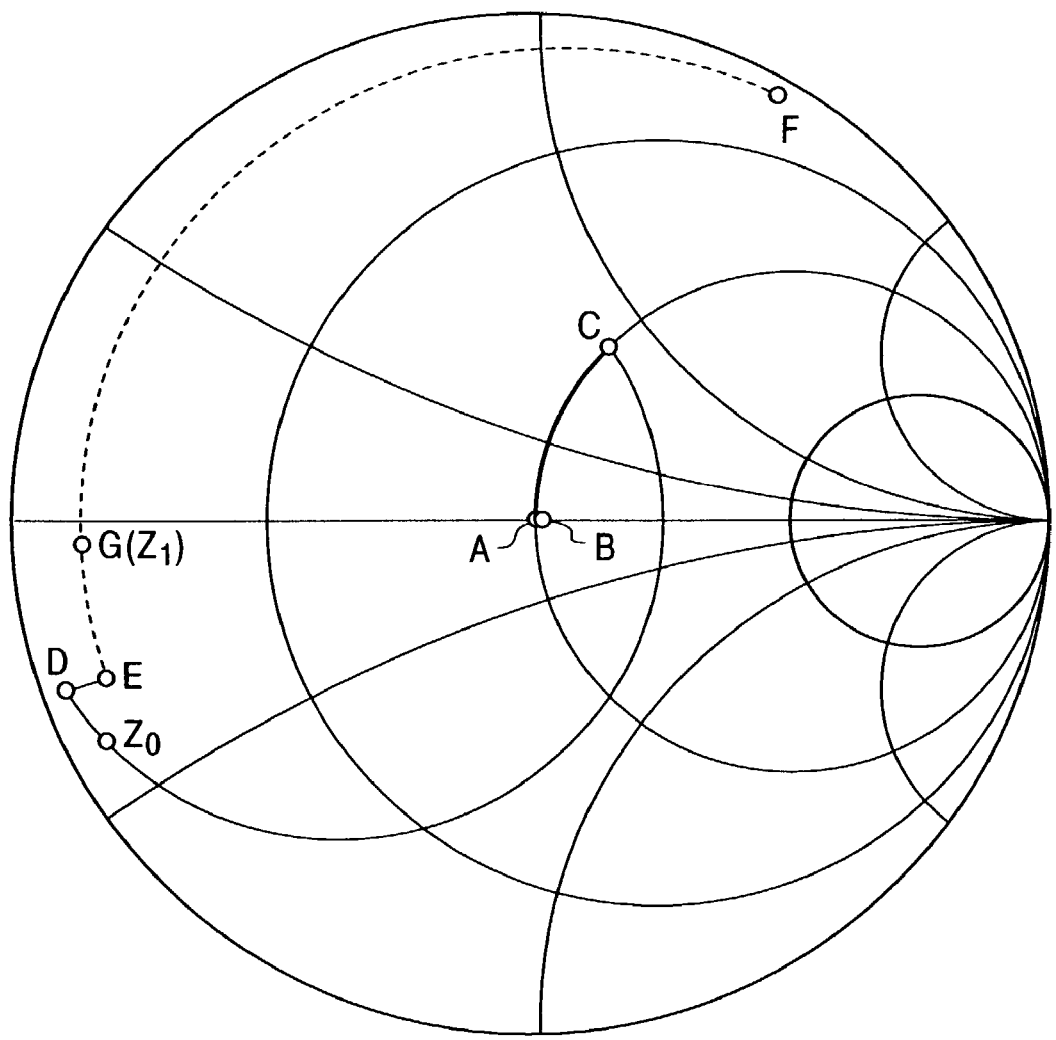
FIG. 17 is a Smith chart illustrating a change in impedance of each component of the matching circuit shown in FIG. 16.

Based on the calculated capacitances, the tuning capacitor 255 corresponds to the tuning capacitor 105 shown in FIG. 16, and the load capacitor 256 corresponds to the load capacitor 106 shown in FIG. 16.

Each calculated capacitance is determined by adding the differential capacitance to the initial capacitance, as described above. When the displacement meter 208 detects the displaced position of the tuning capacitor 255, the capacitance can be directly determined using the displaced position with reference to a corresponding function or lookup table.

The computing unit 71 calculates the impedance Z1 from the values for the inductance of the tuning inductor 254, the resistance of the parasitic RF resistor 253 of the tuning inductor 254, the inductance of the parasitic inductor 102 of the feed plate, the resistance of the parasitic resistor 101 of the feed plate, the calculated capacitance of the load capacitor 256, and the calculated capacitance of the tuning capacitor 255. For example, for the circuit constants shown in FIG. 16, the impedance Z1 of the plasma processing chamber CN is 3.6 Ω+j1.4 Ω. The impedance Z1 is calculated, for example, by using a functional relationship between the calculating parameter and the impedance Z1 or a lookup table illustrating the relationship between the calculating parameter and the impedance Z1.

Figure 9:
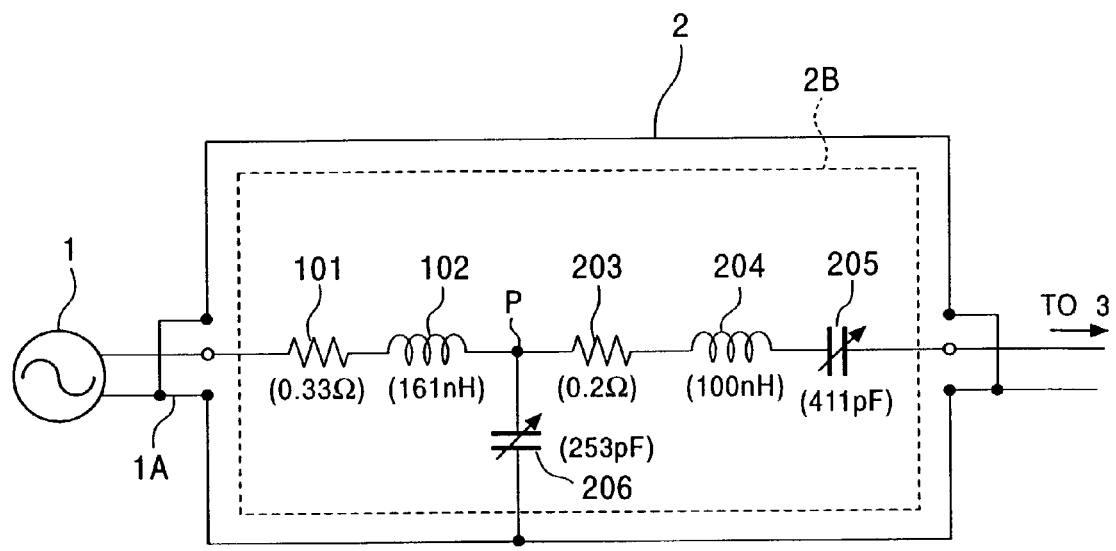
FIG. 9 is a schematic view of a product matching circuit according to the present invention.

The designing unit 72 calculates designed circuit constants, i.e., the capacitance of the load capacitor 206, the inductance of the tuning inductor 204, and the capacitance of the tuning capacitor 205 of the product matching circuit 2B shown in FIG. 9, based on designing parameters including the impedance Z1, the impedance Z0, the inductance of the parasitic inductor 102 of the feed line, and the resistance of the parasitic resistor 101 of the feed line. Each circuit constant is calculated with reference to a function between the corresponding design parameter and the corresponding designed circuit constant or by using a lookup table illustrating the relationship between the corresponding design parameter and the corresponding designed circuit constant.

The designing unit 72 stores the calculated impedance Z1, the calculated capacitance of the load capacitor 206, the designed circuit constants including the inductance of the tuning inductor 204 and the capacitance of the tuning capacitor 205, and the displacement data D1 and D2 received by the computing unit 71, together with the identification number of the plasma processing chamber CN., in the memory unit 73.

FIGS. 10 and 11 are tables illustrating formats of the data stored in the memory unit 73.

Referring to FIG. 10, the memory unit 73 stores the serial number of the plasma processing chamber CN, and the latest impedances Z0 and Z1 for each identification number.

The memory unit 73 stores the detailed data for each identification number according to the format shown in FIG. 11. That is, the data shown in FIG. 11 belongs to the subgroup of the data shown in FIG. 10.

In FIG. 11, the memory unit 73 stores time-series data of the variance D1 of the load capacitor, the variance D2 of the tuning capacitor, the corresponding impedance Z1, the inductance of the tuning inductor 204, the capacitance of the tuning capacitor 205, and the capacitance of the load capacitor 206 in connection with the date of the adjustment for each identification number.

As shown in FIG. 10, the displacement-measuring unit 52 measures the impedance Z0 of the plasma processing chamber CN at a predetermined time interval (for example, every month), and transmits the observed impedance Z0 to the server 70. The server 70 stores the latest impedance Z0 with the identification number into the memory unit 73.

Figure 12:
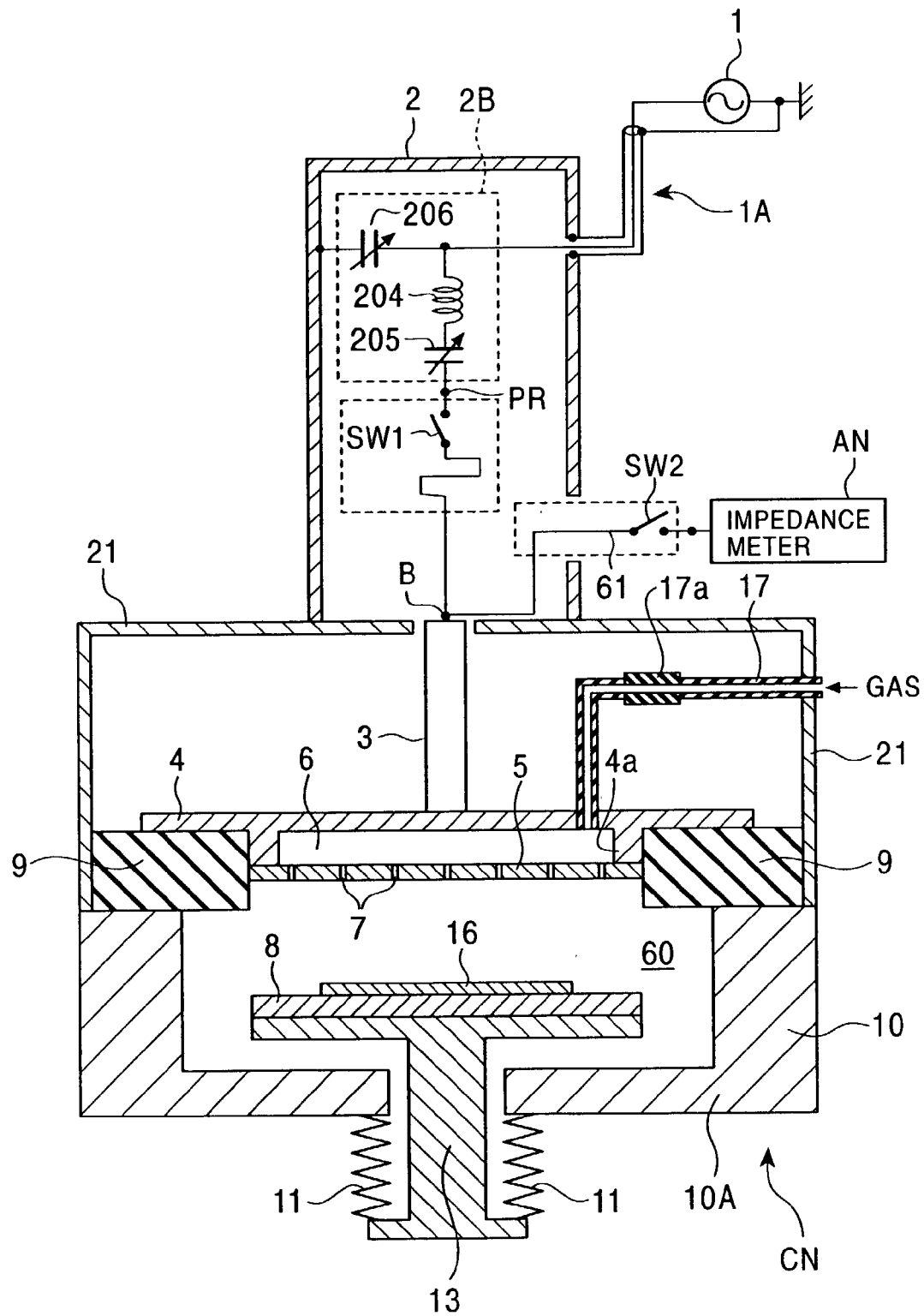
FIG. 12 is a schematic cross-sectional view of a plasma processing chamber unit of a plasma processing apparatus according to the present invention.

FIG. 12 is a schematic view of a plasma processing apparatus according to this embodiment. The matching circuit of this plasma processing apparatus is replaced with the matching circuit 2B, as shown above. The structure of the-matching circuit 2B and the plasma processing chamber CN and a method for measuring the impedance Z0 will now be described.

The plasma processing apparatus of this embodiment is of a single-frequency excitation type and is used for plasma treatments, such as chemical vapor deposition (CVD), sputtering, dry etching, and ashing. Parts having the same functions as in FIG. 6 are referred to with the same reference numerals, and a further detailed description thereof with reference to drawings has been omitted.

Since the impedance Z1 of the plasma processing chamber CN during plasma discharge varies with the gas flow rate, the type of gas, the degree of vacuum, and the distance between the plasma excitation electrode 4 and the wafer susceptor 8, the circuit constants of the matching circuit 2B must be optimized for every plasma treatment.

Furthermore, the plasma processing chamber CN undergoes thermal stress during the plasma treatment. Such thermal stress causes a change in size of the plasma processing chamber CN and thus a gradual change in impedance Z0 during the plasma treatment. Furthermore, the deposition of products formed during the plasma treatments such as etching and film deposition on the inner wall of the plasma processing chamber CN causes a gradual change in impedance Z0.

Such a change in impedance Z0 leads to a change in effective electric power supply to the plasma space. As a result, the plasma treatment is unstable. In this embodiment, the impedance Z0 is monitored to determine the necessity for maintenance of the plasma processing chamber CN so that the plasma process remains stable.

The server 70, as shown in FIG. 8, compared the impedance Z0 transmitted from the displacement-measuring unit 52 with a predetermined impedance specified for initiating maintenance. If the impedance Z0 exceeds the predetermined impedance, the operator is notified of the need for maintenance, for example by a message appearing on a display.

Based on the information, a component or components in the plasma processing chamber CN is exchanged, and the server 70 is used to confirm that the impedance Z0 after the maintenance is performed is less than the predetermined impedance. The server 70 remonitors a change in the impedance Z0 due to thermal stress during the plasma treatment.

The impedance Z0 of the plasma processing chamber CN is measured by the impedance meter AN shown in FIGS. 8 and 12. The displacement-measuring unit 52 controls the impedance meter AN so that the impedance Z0 is measured at a given time interval. In the impedance measurement mode, the switch SW1 is turned off to disconnect the matching circuit 2B from the feed plate 3 whereas the switch SW2 is turned on to connect the measuring terminal of the feed plate 3 to the impedance meter AN.

Thus, the impedance Z0 of the plasma chamber CN is measured at an output terminal PR of the tuning capacitor 205, which is a passive device at the final stage of the matching circuit 2B. The impedance between the switch SW1 and the point B (FIG. 12) is equal to the impedance between the switch SW2 and the point B, thus providing the impedance meter AN an accurate measure of the impedance Z0.

Figure 13:
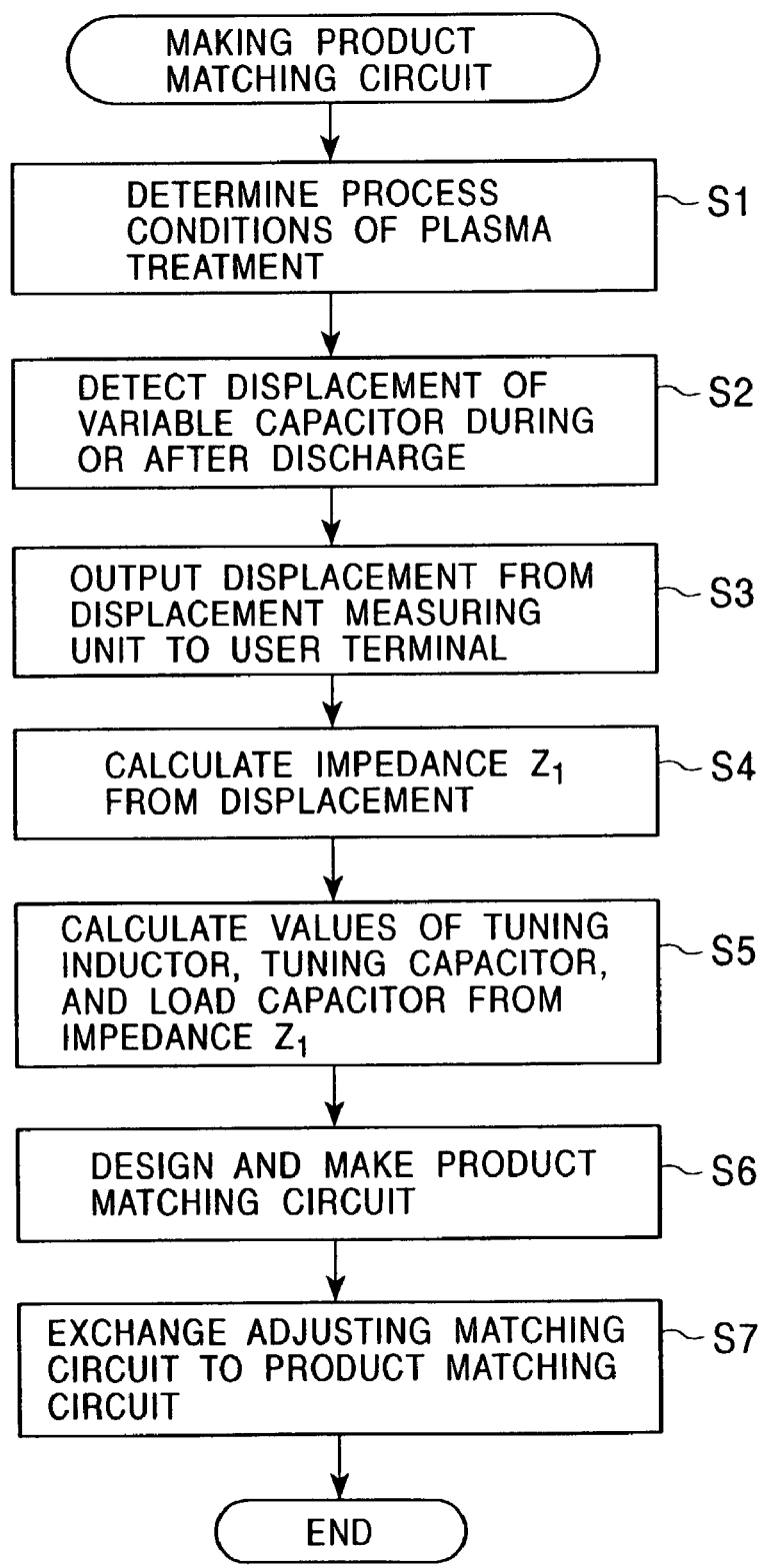
FIG. 13 is a flow chart illustrating an operation of a matching circuit designing system of the plasma processing apparatus shown in FIG. 8.

Referring to FIGS. 8, 9, 12, and 13, the operation of the third embodiment will now be described. FIG. 13 is a flow chart illustrating the operation of the matching circuit designing system of the plasma processing apparatus shown in FIG. 8.

In Step 1 (S1), when the plasma processing apparatus is operated at an operation site 300, the process conditions (gas flow rate, type of gas, degree of vacuum) for a required plasma treatment are determined after a plasma discharge commences. In this step, the drive control unit 51 adjusts the capacitances of the tuning capacitor 255 and the load capacitor 256 of the matching circuit 2A while a plasma is being discharged so that the reflected waves measured by the reflected wave measuring unit 50 is minimized. The impedance matching between the radio frequency generator 1 and the plasma processing chamber CN is thereby achieved.

In Step 2 (S2), the displacement-measuring unit 52 receives the displacement D1 of the load capacitor 256 from the displacement meter 207 and the displacement D2 of the tuning capacitor 255 from the displacement meter 208.

In Step 3 (S3), the displacement-measuring unit 52 outputs the displacements D1 and D2 of the load capacitor 256 and the tuning capacitor 255 to the user terminal 53.

The operator confirms the impedance matching between the radio frequency generator 1 and the plasma processing chamber CN on the display screen of the user terminal 53 and instructs the production of the matching circuit 2B and transmits the displacements D1 and D2 to the server 70.

In Step 4 (S4), the computing unit 71 calculates the adjusted capacitances of the load capacitor 256 and the tuning capacitor 255 based on the displacements D1 and D2 input to the server 70. The computing unit 71 then calculates the impedance Z1 from the adjusted capacitances of the load capacitor 256 and the tuning capacitor 255, the resistance of the parasitic resistor 101, the inductance of the parasitic inductor 102, the inductance of the tuning inductor 254, and the resistance of the parasitic RF resistor 253 of the tuning inductor 254, by referring to a function defining or illustrating the relationship between the impedance and these parameters.

In Step 5 (S5), the designing unit 72 calculates design circuit constants i.e., the capacitance of the load capacitor 206, the inductance of the tuning inductor 204, and the capacitance of the tuning capacitor 205 of the matching circuit 2B shown in FIG. 19 from design parameters i.e., the calculated impedance Z1, the impedance Z0 stored in the memory unit 73, the inductance of the parasitic inductor 102 of the feed line, and the resistance of the parasitic resistor 101 of the feed line, with reference to a function illustrating the relationship between the designing parameters and the design circuit constants. The design circuit constants are set so that the impedance Z0 and the impedance Z1 are within a controllable range of the matching circuit 2B. Preferably, the controllable range has a slight margin.

In Step 6 (S6), the matching circuit 2B is designed based on the resulting circuit constants and is produced based on the design.

In Step 7 (S7), the matching circuit 2B produced is sent to the operation site 300. The matching circuit 2A of the plasma processing apparatus at the operation site 300 is replaced with the matching circuit 2B and the plasma processing apparatus is used in device production.

Figure 14:
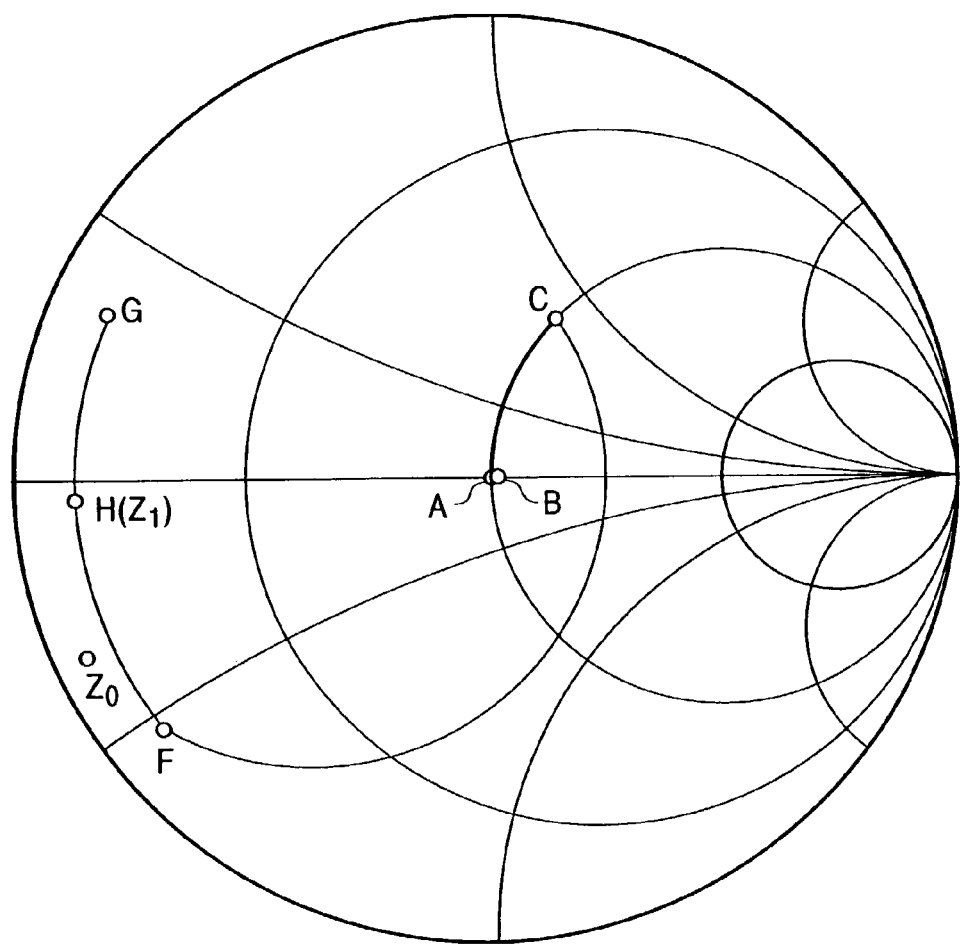
FIG. 14 is a Smith chart illustrating a change in impedance of each component of the product matching circuit shown in FIG. 9.

The design circuit constants of elements constituting the optimized matching circuit 2B shown in FIG. 9 are confirmed with a Smith chart shown in FIG. 14.

The point A indicates a characteristic impedance of 50 Ω of a power supply system including the radio frequency generator 1 and the coaxial cable 1A at the input side of the matching circuit 2B. The point B indicates an impedance shift by the resistor 101 and the point C indicates an impedance shift by the inductor 102. Furthermore, the point F indicates an impedance shift by the load capacitor 206 and the resistor 203, and the point G indicates an impedance shift by the tuning inductor 204.

In this Smith chart, the point H indicates the final output impedance of the matching circuit 2C. Since this final output impedance has a conjugate complex value with respect to the load impedance of the plasma processing chamber CN, the impedance Z1* at the point H is 3.6 Ω−j1.4 Ω, wherein the impedance Z1* is the conjugate complex impedance of the impedance Z1. Thus, the final impedance matching from the point A to the point H is achieved by the shift from the point G to point H by the tuning capacitor 205.

The inductance of the tuning inductor 204 is significantly smaller than that of the tuning conductor of the matching circuit 2A. Thus, the resistance of the parasitic RF resistor 203 decreases. As a result, the arc (on the impedance chart) of the tuning inductor 204 contacts with the arc (on the admittance chart) of the load capacitor 206 at the point F.

Since the impedance Z1 (at point H) and the impedance Z0 are known, the inductance of the tuning inductor 204 and the capacitance of the tuning capacitor 205 can be optimized within the adjustable range between the points F and G. Since the adjustable range is minimized, mismatching loss is also minimized.

In the product matching circuit according to the present invention, the resistance (0.2 Ω) of the parasitic RF resistor 203 is one order of magnitude smaller than that (2.72 Ω) of the conventional parasitic resistor 103 shown in FIG. 16. Thus, electrical loss consumed in the parasitic RF resistor is reduced by one order of magnitude. Accordingly, the product matching circuit according to the present invention exhibits reduced circuit loss.

As described above, in the matching circuit designing system of the present invention, the impedance Z1 for plasma discharge is determined using the matching circuit 2A, and a matching circuit 2B suitable for this impedance Z1 is produced. Thus, impedance mismatching and circuit loss in the matching circuit are reduced. Accordingly, the plasma processing apparatus can be operated with reduced input energy.

Thus, electrical power can be more effectively transferred to the plasma space, and the efficiency of the plasma treatment is improved.

The present invention may include various modifications of the above embodiments.

For example, the computing unit 71 may be connected to the user terminal 53 at the operation site 300 in place of the system configuration shown in FIG. 8.

That is, the computing unit 71 may be connected to the communication line 91 via the user terminal 53. In this case, the computing unit 71 calculates the impedance Z1 based on the displacements D1 and D2 from the displacement-measuring unit 52. The user transmits the impedance Z1 from the user terminal 53 to the server 70. The designing unit 72 calculates the design circuit constants based on designing parameters including the impedance Z1 input from the server 70.

Alternatively, the computing unit 71 and the designing unit 72 may be connected to the user terminal 53 placed at the operation site 300, in place of the configuration shown in FIG. 8. That is, the computing unit 71 and the designing unit 72 may be connected to the communication line 91 via the user terminal 53. The computing unit 71 calculates the impedance Z1 based on the displacements D1 and D2 from the displacement-measuring unit 52.

The designing unit 72 calculates the designing circuit constants based on the design parameters including the impedance Z1 received from the server 70. The user transmits the designing circuit constants from the user terminal 53 to the server 70.

In the above modifications, the places of the computing unit 71 and the designing unit 72 are different, and other system configuration and operation are the same as those in the above embodiments.

It should be understood that apparently widely different embodiments of this invention may be made without departing from the spirit and scope of the invention, and that the invention is not limited to the specific embodiments thereof except as defined in the appended claims.

What is claimed is:

1. A plasma processing apparatus comprising:
a radio frequency generator;
a plasma processing chamber;
a matching circuit for impedance matching between the radio frequency generator and the plasma processing chamber; and
a matching circuit adjusting means for matching a output impedance of the matching circuit to the impedance of the plasma processing chamber in a nondischarge state.

2. A plasma processing apparatus according to claim 1, further comprising discharge-detecting means for detecting the start of the discharge in the plasma processing chamber, wherein the matching circuit adjusting means matches the output impedance of the matching circuit to the impedance of the plasma processing chamber, upon the detection of the start of the discharge by the discharge-detecting means.

3. A plasma processing apparatus according to claim 1, wherein the plasma processing chamber has a measuring terminal for measuring the impedance of the plasma processing chamber before discharge.

4. A method for operating a plasma processing apparatus, comprising:
a first matching circuit adjusting step of matching an output impedance of a matching circuit to an impedance of the plasma processing chamber before discharge;
a power feeding step of feeding RF power to the plasma processing chamber;
a discharge detecting step of detecting discharge by the RF power in the plasma processing chamber; and
a second matching circuit adjusting step of matching the output impedance of the matching circuit to the impedance of the plasma processing chamber during the discharge.

5. A plasma processing method comprising:
a first matching circuit adjusting step of matching an output impedance of a matching circuit to an impedance of the plasma processing chamber before discharge;
a power feeding step of feeding RF power to the plasma processing chamber;
a discharge detecting step of detecting discharge by the RF power in the plasma processing chamber; and
a second matching circuit adjusting step of matching an output impedance of the matching circuit to an impedance of the plasma processing chamber during the discharge.

6. A plasma processing apparatus comprising:
a radio frequency generator;
a plasma processing chamber; and
a product matching circuit for impedance matching between the radio frequency generator and the plasma processing chamber;
wherein the product matching circuit is produced based on a circuit constant of an adjusting matching circuit which is disposed between the radio frequency generator and the plasma processing chamber for a required plasma treatment and the circuit constant is determined by impedance matching between the radio frequency generator and the plasma processing chamber so that the adjusting matching circuit matches the load impedance of the plasma processing chamber; and
wherein the product matching circuit adjusts the impedance within a range including an impedance Z0 before plasma discharge and an impedance Z1 after plasma discharge of the plasma processing chamber.

7. A plasma processing apparatus comprising:
a radio frequency generator;
a plasma processing chamber; and
a product matching circuit for impedance matching between the radio frequency generator and the plasma processing chamber;
wherein the product matching circuit is produced based on a circuit constant of an adjusting matching circuit which is disposed between the radio frequency generator and the plasma processing chamber for a required plasma treatment and the circuit constant is determined by impedance matching between the radio frequency generator and the plasma processing chamber so that the adjusting matching circuit matches the load impedance of the plasma processing chamber; and wherein the plasma processing chamber has a measuring terminal that measures an impedance Z0 of the plasma processing chamber before plasma discharge.

8. A matching circuit designing system of a plasma processing apparatus comprising:
- an adjusting matching circuit of which the output impedance is controlled by adjusting an internal variable passive device;
- displacement measuring means for measuring the displacement of the variable passive device by drive means;
- reflected wave measuring means for measuring reflected waves of electric power supplied from a radio frequency generator when a plasma is discharged;
- drive control means for controlling the variable passive device by the drive means to minimize the reflected waves;
- computing means for calculating the impedance Z1 of the plasma processing chamber after the plasma is discharged, based on the displacement at the minimized reflected waves; and
- designing means for designing the circuit constant of the passive device constituting the product matching circuit based on the impedance Z1,
- wherein these means are connected through an information communication network by communication means, and
- wherein the plasma processing chamber comprises impedance measuring means for measuring the impedance Z0 of the plasma processing chamber before plasma discharge, the impedance measuring mean outputting the impedance Z0 to the designing means.

9. A matching circuit designing system according to claim 8, further comprising memory means that is connected to the information communication network and stores the impedance Z0, the impedance Z1, and an identification number of the matching circuit.

10. A matching circuit designing system according to claim 8, further comprising memory means that is connected to the information communication network and stores the impedance Z0, the impedance Z1, and an identification number of the matching circuit.

11. A plasma processing apparatus comprising:
- a radio frequency generator;
- a plasma processing chamber; and
- a matching circuit for impedance matching between the radio frequency generator and the plasma processing chamber, wherein the output impedance of the matching circuit is adjustable to match the impedance of the plasma processing chamber in a nondischarge state, the adjustment based at least in part on a first stored value corresponding to the impedance of the plasma chamber in a non-discharge state.

12. A plasma processing apparatus according to claim 11, further comprising a plasma discharge detector for detecting the start of the discharge in the plasma processing chamber, wherein the plasma processing apparatus is further configured to adjust the output impedance of the matching circuit to the impedance of the plasma processing chamber, upon the detection of the start of the discharge.

13. A plasma processing apparatus according to claim 12, wherein the adjustment is based at least in part on a second stored value corresponding to the impedance of the plasma chamber in a plasma discharge state.

14. A plasma processing apparatus according to claim 13, wherein the second stored value is determined from an impedance measurement taken at the output terminal of the matching circuit after a matched state has been reached during plasma discharge.

15. A plasma processing apparatus according to claim 13, further comprising a reflected wave detector coupled with the plasma chamber wherein a fine adjustment of the matching circuit occurs to correspond to minimized reflected waves.

16. A plasma processing apparatus according to claim 11, wherein the plasma processing chamber comprises a measuring terminal for measuring the impedance of the plasma processing chamber in a non-discharge state.

17. A plasma processing apparatus according to claim 11, wherein the first stored values is determined from a nondischarge impedance measurement taken at the output terminal of the matching circuit.

18. A plasma processing apparatus according to claim 11, further comprising a memory for storing at least the first stored value.

19. A matching circuit designing system for a plasma processing apparatus comprising:
- an adjustable matching circuit having an output impedance controllable by adjusting an internal variable passive device;
- a displacement measuring unit configured for measuring the displacement of the variable passive device from a reference position;
- a reflected wave detector configured to measure reflected waves of electric power supplied from a radio frequency generator when a plasma is discharged into a plasma processing chamber;
- a drive control unit for controlling the variable passive device to minimize the reflected waves;
- a processor configured to calculate the impedance Z1 of the plasma processing chamber after the plasma is discharged, based on the displacement of the variable passive device at the minimized reflected waves; and
- a design subsystem configured to design a product matching circuit having a passive device with a circuit constant, wherein the design of the product matching circuit is based on the impedance Z1, and
- wherein the design subsystem and the processor are connected through an information communication network by communication means.

20. A matching circuit designing system according to claim 19, wherein the plasma processing chamber comprises an impedance measuring device for measuring the impedance Z0 of the plasma processing chamber in a non-discharge state, the impedance measuring device being configured to transmit the impedance Z0 to the design subsystem.

21. A matching circuit designing system according to claim 20, further comprising memory connected to the information communication network and stores the impedance Z0, the impedance Z1, and an identification number of the matching circuit.

22. A matching circuit designing system according to claim 19, further comprising memory connected to the information communication network and configured to store the impedance Z0, the impedance Z1, and an identification number of the matching circuit.

* * * * *